United States Patent [19]

Gruber et al.

[11] Patent Number: 5,388,635
[45] Date of Patent: Feb. 14, 1995

[54] COMPLIANT FLUIDIC COOLANT HAT

[75] Inventors: Peter A. Gruber, Mohegan Lake; Arthur R. Zingher, White Plains, both of N.Y.

[73] Assignee: International Business Machines Corporation, Armonk, N.Y.

[21] Appl. No.: 883,051

[22] Filed: May 8, 1992

Related U.S. Application Data

[63] Continuation of Ser. No. 515,889, Apr. 27, 1990, abandoned.

[51] Int. Cl.⁶ .............................................. F28F 7/00
[52] U.S. Cl. ................................ 165/80.4; 165/185; 165/46; 257/714; 361/699; 361/701; 361/702
[58] Field of Search ...................... 165/46, 80.3, 80.4, 165/80.5, 185; 361/382, 383, 385; 357/82, 83

[56]  References Cited

U.S. PATENT DOCUMENTS

| | | |
|---|---|---|
| 3,361,195 | 1/1968 | Meyerhoff et al. ............... 361/385 |
| 3,405,323 | 10/1968 | Surty et al. ...................... 317/100 |
| 3,626,252 | 12/1971 | Cath ................................ 317/100 |
| 4,069,497 | 1/1978 | Steidlitz ........................... 357/80 |
| 4,072,188 | 2/1978 | Wilson et al. .................... 165/80 |
| 4,092,697 | 5/1978 | Spaight ............................. 361/386 |
| 4,109,707 | 8/1978 | Wilson et al. .................... 165/46 |
| 4,138,692 | 2/1979 | Meeker et al. ................... 165/80.4 |
| 4,151,547 | 4/1979 | Rhodes et al. .................... 357/81 |
| 4,226,281 | 10/1980 | Chu ................................... 165/80 A |
| 4,233,645 | 11/1980 | Balderes et al. ................. 361/385 |
| 4,258,411 | 3/1981 | Sherman .......................... 361/386 |
| 4,264,431 | 3/1981 | Babuka et al. ................... 357/82 |
| 4,323,914 | 4/1982 | Berndlmaier et al. ........... 357/82 |
| 4,341,432 | 7/1982 | Cutchaw .......................... 339/112 L |
| 4,381,032 | 4/1983 | Cutchaw .......................... 165/46 |
| 4,386,505 | 6/1983 | Little ................................ 165/185 |
| 4,462,462 | 7/1984 | Meagher et al. ................. 165/80 C |
| 4,468,717 | 8/1984 | Mathias et al. .................. 361/385 |
| 4,475,152 | 10/1984 | Ikegame et al. ................. 361/385 |
| 4,494,171 | 1/1985 | Bland et al. ...................... 361/386 |
| 4,531,146 | 7/1985 | Cutchaw ........................... 357/82 |
| 4,546,409 | 10/1985 | Yoshino et al. .................. 361/387 |
| 4,551,787 | 11/1985 | Mittal et al. ..................... 361/387 |
| 4,558,395 | 12/1985 | Yamada et al. .................. 361/385 |
| 4,559,580 | 12/1985 | Lutfy ................................ 361/385 |
| 4,561,011 | 12/1985 | Kohara et al. ................... 356/81 |
| 4,561,040 | 12/1985 | Eastman et al. ................. 361/385 |
| 4,567,505 | 1/1986 | Pease et al. ...................... 357/81 |

(List continued on next page.)

FOREIGN PATENT DOCUMENTS

| | | |
|---|---|---|
| 0002883 | 7/1979 | European Pat. Off. . |
| 0014249 | 8/1980 | European Pat. Off. . |
| 966944 | 10/1982 | U.S.S.R. ............................ 361/383 |

OTHER PUBLICATIONS

Anacker, "Liquid Cooling of Integrated Circuit Chips", IBM Technical Disclosure Bulletin, vol. 20, No. 9, Feb. 1978, pp. 3742, 3743.

D. B. Tuckerman et al, "High-Performance Heat Sinking for VLSI", IEEE Electron Dev. Lett., vol. EDL-2, No. 5, May 1981, pp. 126–129.

Blodgett et al, "Thermal Conduction Module: A High--Performance Multilayer Ceramic Package", IBM J.

(List continued on next page.)

*Primary Examiner*—John Rivell
*Assistant Examiner*—L. R. Leo
*Attorney, Agent, or Firm*—Philip J. Feig; David Aker

[57] ABSTRACT

A cooling hat for transferring heat from a surface or plurality of heat generating components to a flowing fluid includes a coldsheet, a plurality of manifold layers and springs. The coldsheet is typically a medium-thin metal sheet usually with fine fins or grooves to readily transfer heat to a coolant. Each manifold layer is typically molded rubber with conduits for coolant supply and return. The conduits form a branched hierarchy. The fluid flow is highly parallel and streamlined which achieves ample flow with small hydraulic differential pressure. Springs gently urge the cooling hat against the thermal joints hence against the components. The hat can bend slightly to conform to a curved surface. Typically some compliance is provided by the hat, and other compliance is provided by a thermal joint between each component and the coldsheet. The system is highly self-aligned for counteracting variations.

48 Claims, 29 Drawing Sheets

U.S. PATENT DOCUMENTS

| | | | |
|---|---|---|---|
| 4,602,314 | 7/1986 | Broadbent | 361/386 |
| 4,607,277 | 8/1986 | Hassan et al. | 357/81 |
| 4,612,601 | 4/1986 | Watari | 361/387 |
| 4,635,709 | 1/1987 | Altoz | 361/385 |
| 4,639,829 | 1/1987 | Ostergren | 361/386 |
| 4,730,665 | 3/1988 | Cutchaw | 165/80 |
| 4,730,666 | 3/1988 | Flint et al. | 165/80.4 |
| 4,758,926 | 7/1988 | Herrell et al. | 361/385 |
| 4,765,397 | 8/1988 | Chrysler et al. | 361/385 |
| 4,884,630 | 12/1989 | Nelson et al. | 361/385 |
| 4,923,003 | 5/1990 | Stenlund | 165/154 |
| 4,953,634 | 9/1990 | Nelson et al. | 165/80.3 |

OTHER PUBLICATIONS

Res. Develop., vol. 26, No. 1, Jan., 1982, pp. 30–36.

H. Martin, "Heat and Mass Transfer Between Impinging Gas Jets and Solid Surfaces", Advance Heat Transfer, vol. 13 (1977).

R. C. Chu, IBM TDB "Design for Providing Thermal Interface Material Between Narrow Thermal Interface Gaps", vol. 20, No. 7, Dec. 1977, pp. 2761–2762.

R. C. Chu et al, IBM TDB "Force–Free Solid Thermal Conduction Module", vol. 23, No. 3, Aug. 1980, pp. 1123–1124.

J. A. Andrews, "Parallel Printed Circuit Manifold", Motorola Technical Developments, vol. 7, Oct. 1987, pp. 22–23.

"Flexible Manifold System For Supply And Return Connectins To An Array of Liquid-Cooled Heat-Transfer Elements In A Circuit Module", IBM Technical Disclosure Bulletin, vol. 30, No. 5, Oct. 1987, pp. 317–318.

J. A. McDonald et al, "Custom Tailoring of Chip Temperatures In A Singular Temperature Environment", IBM Technical Disclosure Bulletin, vol. 21, No. 6, Nov. 1978, pp. 2441–2442.

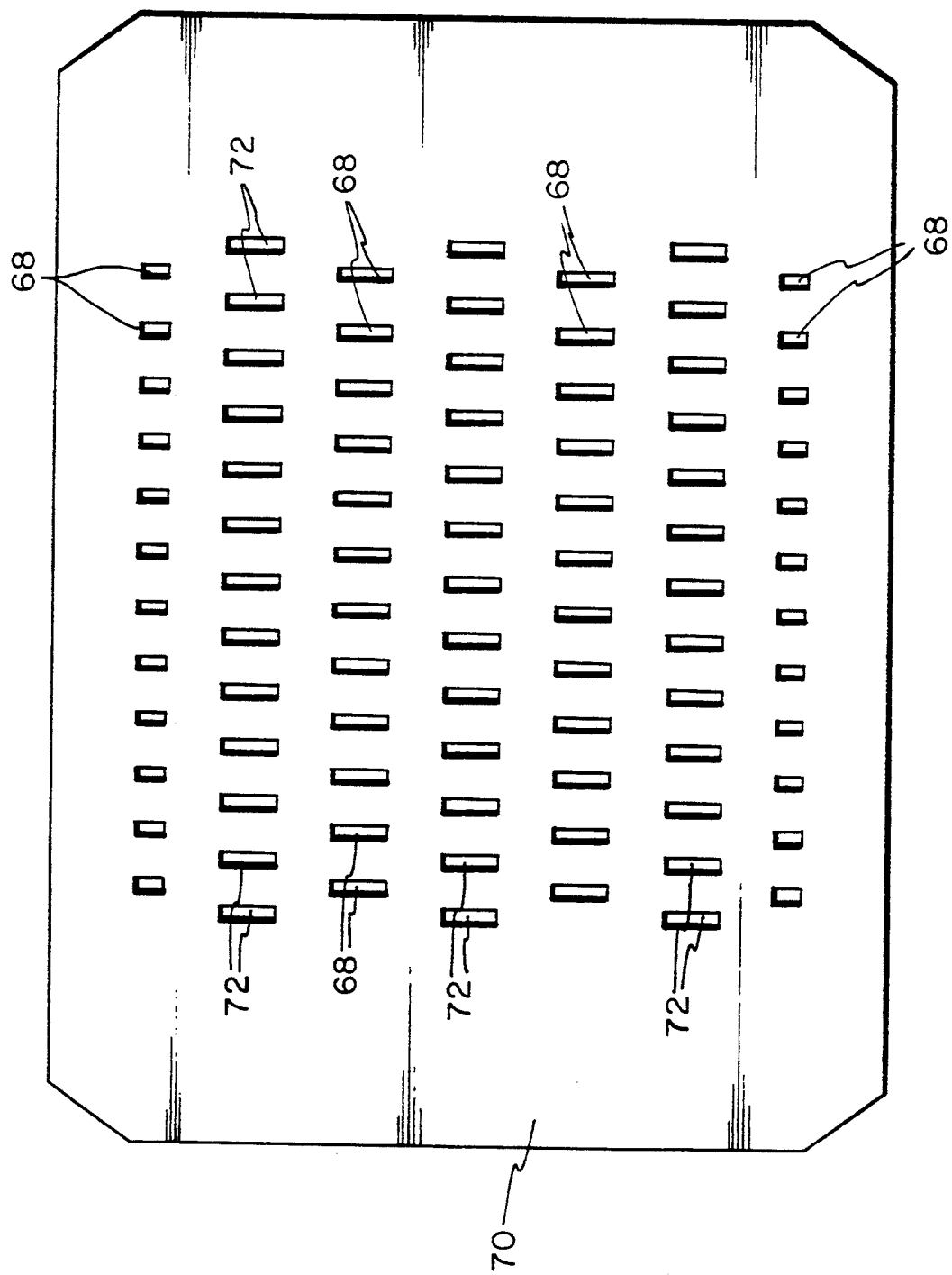

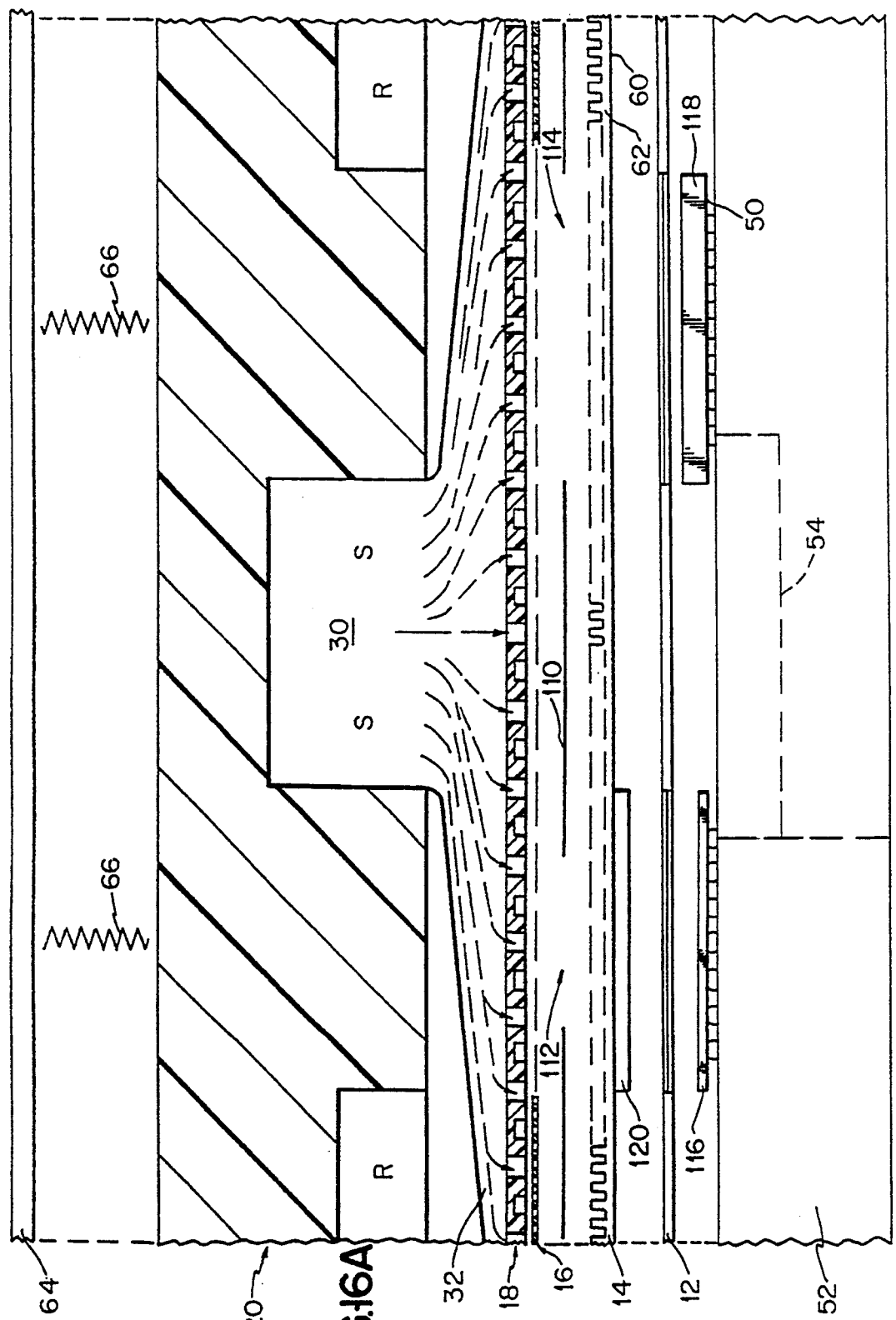

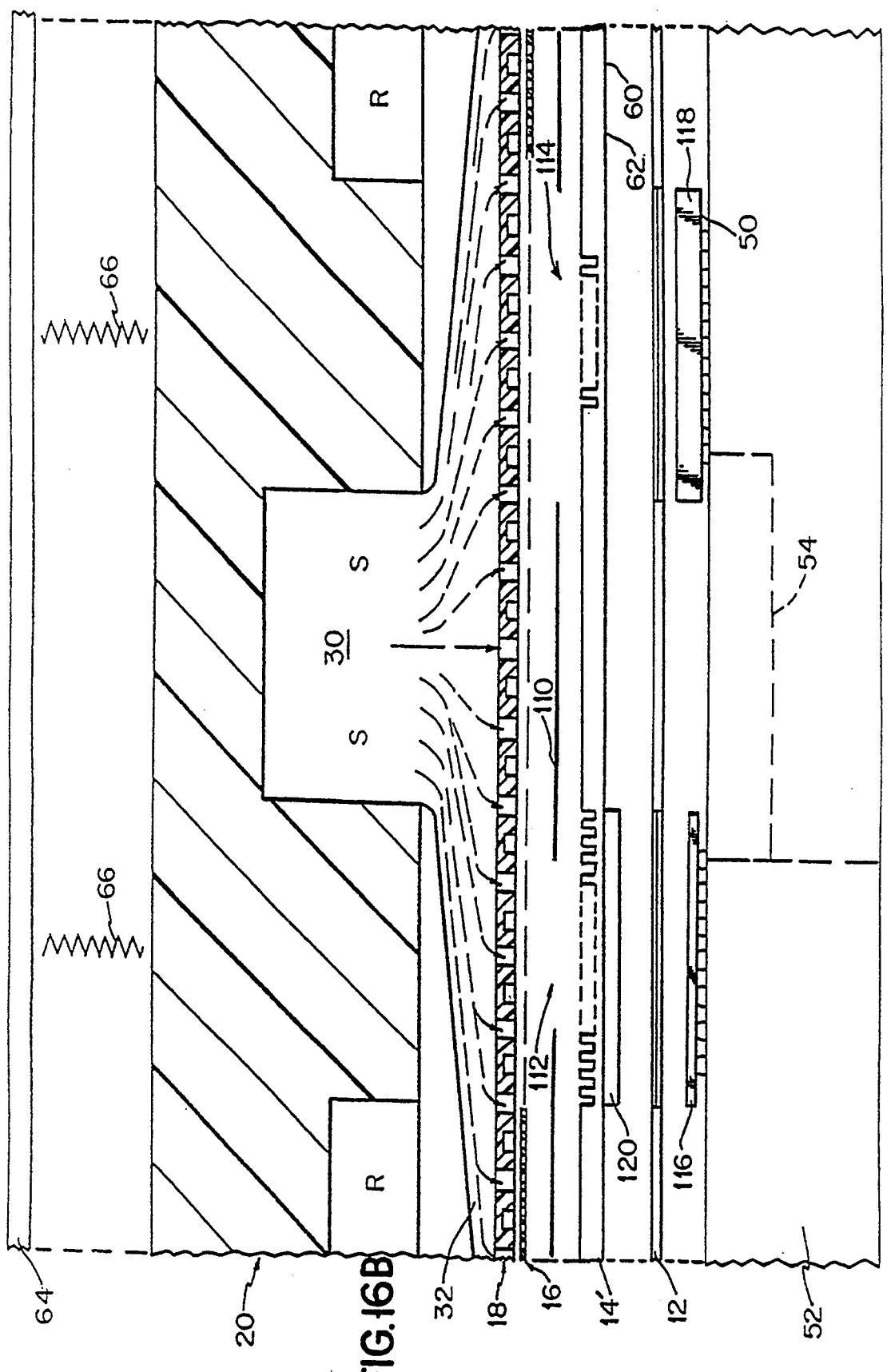

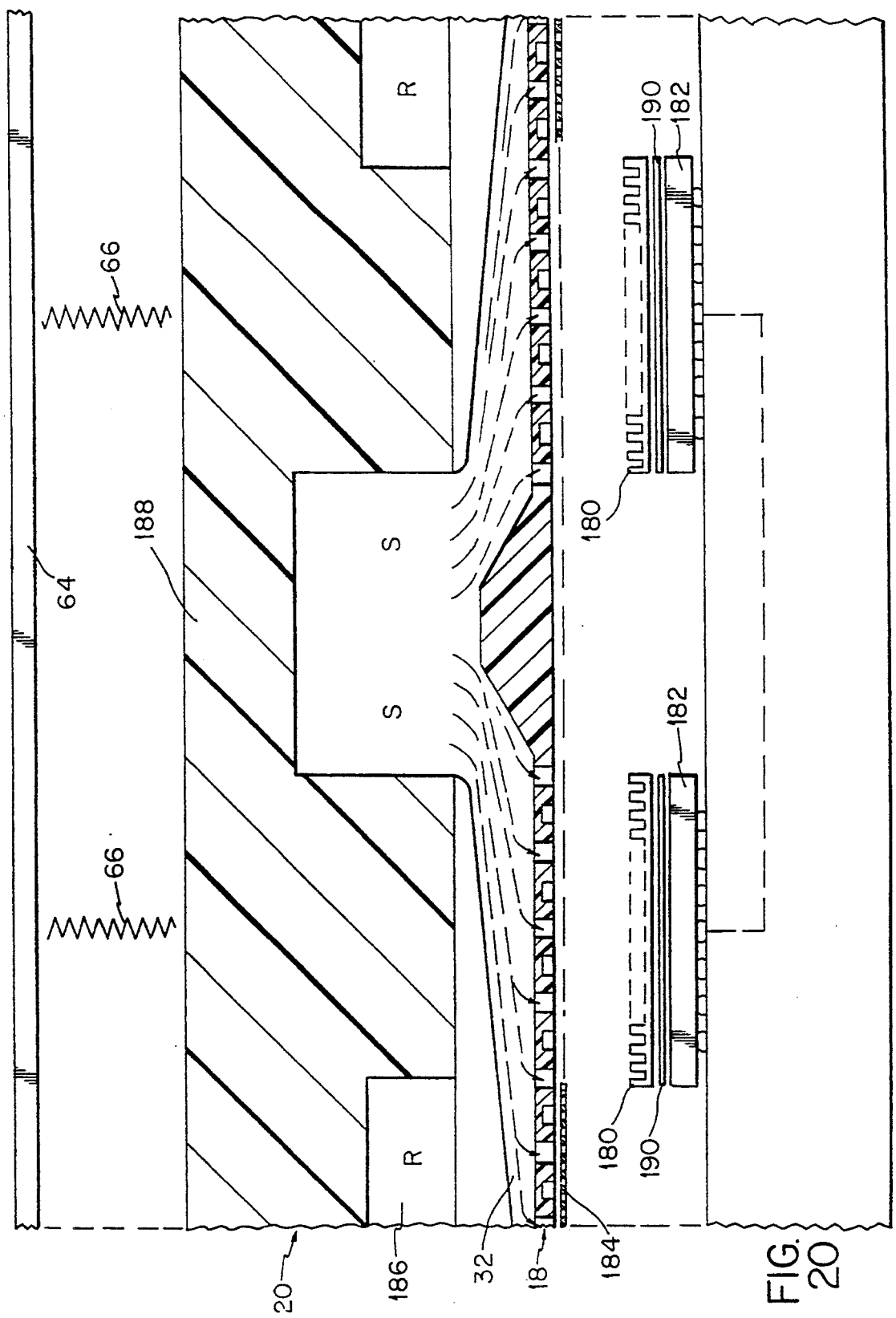

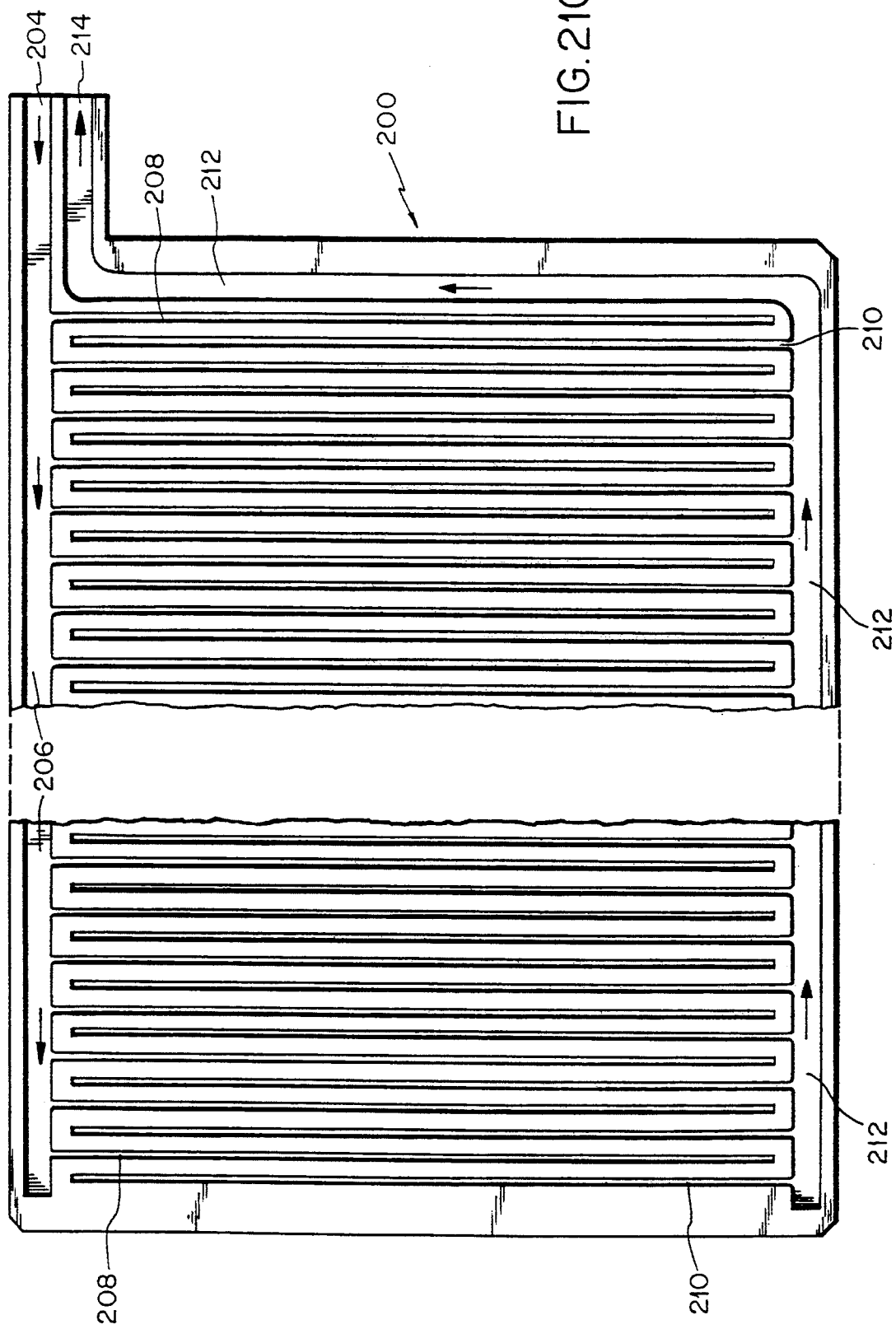

COMPLIANT FLUIDIC COOLANT HAT

This application is a continuation of application Ser. No. 07/515,889, filed Apr. 27, 1990, now abandoned.

BACKGROUND OF THE INVENTION

The present invention relates to a cooling structure which provides heat transfer between electronic components and a flowing coolant including a cooling hat comprising a coldsheet, a plurality of manifold layers and springs. Each manifold layer includes a branched hierarchy of conduits for coolant supply and coolant return. A highly parallel and streamlined flow achieves ample fluid flow with a small hydraulic differential pressure. The springs, when present, force the cooling hat into intimate contact with the surface to be cooled.

High speed computers and other fast electronic systems often require assemblies of many integrated circuit chips where each chip contains many active devices, and many chips are spaced closely together. During normal operation the devices dissipate a very large power density, especially bipolar transistor devices. Proper electronic operation of the devices necessitates a cool operating temperature which, in turn, requires adequately cooling of the power density. Conversely the maximum allowable operating temperature of the devices and integrated circuit chips in combination with the limited cooling capability presently available limit the allowable power density, circuit density and system speed. Improved device and integrated circuit chip cooling results in increased permissible power density, circuit density and system speed.

The prior art contains many forms of cooling. One form of cooling which has been proposed is the use of a metal plate held against circuit chips by springs, as is disclosed by Cutchaw in U.S. Pat. No. 4,381,032. A heat exchanger incorporating a deflectably movable diaphragm in forced engagement with an integrated circuit package is disclosed by Cutchaw in U.S. Pat. No. 4,341,432. Another form of heat exchanger for cooling electronic circuits provides for passages within which liquid coolant is circulated, the coolant contacting a flexible wall which is urged against the circuitry to be cooled as shown by Wilson et al, in U.S. Pat. No. 4,072,188. Another form of heat exchanger employs coated metallic dendrites which are held by springs against a circuit chip as disclosed by Babuka et al in U.S. Pat. No. 4,254,431. Yet another form of heat exchanger employs a pillow structure formed of a film and filled with a thermal liquid material for extracting heat from an electric circuit, as is disclosed by Spaight, in U.S. Pat. No. 4,092,697. Also a malleable dimpled wafer is deformed by pressure between a heat source such as an electronic circuit and a heat sink, as is disclosed by Rhoades et al in U.S. Pat. No. 4,151,547. Other U.S. patents showing a single layer of material interposed between a circuit chip and a cooling device are Steidlitz, U.S. Pat. No. 4,069,497; Balderes et al, U.S. Pat. No. 4,233,645; Yoshino et al, U.S. Pat. No. 4,546,409; Kohara et al, U.S. Pat. No. 4,561,011; Hassan et al, U.S. Pat. No. 4,607,277; Watari, U.S. Pat. No. 4,612,601; Ostergren et al, U.S. Pat. No. 4,639,829; and Meagher et al, U.S. Pat. No. 4,462,462. The use of liquid and reentrant cavities at a thermal interface is disclosed by Pease, Tuckerman and Swanson in U.S. Pat. No. 4,567,505. The use of a composite structure of a conformal coating plus liquid at a thermal interface is disclosed by Berndlmaier et al, in U.S. Pat. No. 4,323,914. A theoretical discussion of cooling considerations is presented in an article in the IEEE Electron Devices Letters, "High Performance Heat Sinking For VLSI" by D. B. Tuckerman and R. F. W. Pease, Vol. EDL-2, No. 5, May 1981. Broadbent, U.S. Pat. No. 4,602,314 and Sherman, U.S. Pat. No. 4,258,411 disclosed a flexible thermally conductive body disposed between a semiconductor device and a heat sink. U.S. Pat. No. 3,626,252 discloses a silicone grease loaded with thermally conductive particles disposed between a heat sink and an electronic device.

A well known thermal joint is a single thin layer of oil disposed between a chip and a cooling means. A crude thermal joint is a dry joint between a chip and a cooling means. Such a thermal joint provides contact only at tiny asperities, and everywhere else there are tiny air gaps and poor thermal conduction.

The foregoing cooling systems are inadequate for modern electronic systems, particularly bipolar chips packaged closely together in a Multi Chip Module. Therefore, a piston-linkage cooling system has been used. One example of such a cooling system is described in the IBM Journal of Research and Development, Vol 26 No. 1, January 1982. In the described arrangement approximately 100 bipolar semiconductor chips are each bonded face down. Numerous small solder balls connect each chip to a common printed circuit. The solder ball is a Controlled Collapse Chip Connector (so-called C4 connectors), and the printed circuit is a Multi-Layer Ceramic substrate. Adjacent to these chips is a cooling hat. Each chip is adjacent to a small piston disposed in a socket in a water cooled metal block. During operation, each chip generates heat which is removed. The heat is conducted from the back of the chip, across a small gap to the tip of the piston, along the length of the piston, across a gap to the socket, through the metal block, and finally is removed by convection into the flowing water. In some modifications the piston tip is made flat for better thermal contact with the chip, there is oil between the chip and the piston, and there is thermal paste between the piston and the socket. The modifications provide a certain degree of improved cooling ability.

The piston is designed for movement within its socket to compensate for manufacturing tolerances and thermal distortions. To compensate for chip height variations, the piston is made to slide in the socket in a direction perpendicular to the chip surface. To compensate for chip tilt variations, the piston is designed to tilt within the socket. To compensate for lateral distortions (due to non-uniform thermal expansion), the piston tip is able to slide laterally over the chip surface or alternatively to slightly rotate or slide laterally in its socket. The various compliance modes prevent chip-to-chip variations from causing large stresses and hence damage. However, achieving the compliance modes requires sufficient clearance between the chip and the piston, and between the piston and the socket.

The prior art cooling schemes contain short comings and limitations. In order to effectively remove heat from high power density chips, where many chips are closely packaged on a multichip module, a "tight" thermal path is required from each chip to the coolant. The tight thermal path requirement conflicts with a "loose" path requirement such as is required for the above described compliance modes. In order to protect the fragile C4 connectors, the cooling system must not apply large stresses. Unfortunately, manufacturing variations result in significantly different chip heights and tilts. Also, differential thermal expansion significantly distorts the geometry of the system components so that a completely rigid system would develop excessive stresses. Temperature changes cause thermal expansion or contraction of the chips, substrate and cooling hat. The thermal expansion depends on the material involved, and is generally different for each element. During start up and cool down, there is non-uniform temperature and expansion, which also causes unequal thermal expansion and resultant thermal distortions. If not compensated, damaging stresses may develop at interconnections between the elements. For example, unequal thermal distortion parallel to the substrate surface will cause shear stress and eventual failure of the C4 balls. Such a failure mode must be prevented.

As electronic systems continue to advance, the piston linkage and other cooling systems noted above become inadequate. In some cases, there is too much thermal resistance. In still other cases, the cooling does not provide adequate compliance to counteract variations and distortions. In still other cases, the cooling is excessively complex when applied to a Multi Chip Module containing many chips.

One example of the general problem is the design conflict manifest in piston cooling. To improve heat transfer typically requires tighter clearance, tolerance, and smoothness (from chip to piston tip, and from piston to socket). By contrast, adequate motion and economical manufacturing favor a design with looser clearance, and the like.

One partial solution is to use oil or thermally enhanced paste in the gaps between elements (i.e., between the chip and the piston, or between the piston and the socket). Another partial solution is to design a more sophisticated geometry in which the piston and block are reshaped to increase their contact area. For example, the piston may be reshaped to increase the area adjacent to the metal block. Nevertheless these partial solutions while beneficial do not fully resolve the design conflict.

A single chip module in combination with a printed circuit board may also be employed to package many chips close together. An example is a dual in-line package containing one chip, attached leads, and a plastic housing. The single chip modules are mounted on a common printed circuit board. Some applications might employ single chip modules with printed circuit boards to achieve close chip packing density and high chip power density. Even using such designs, when there is very high performance, a design conflict is manifest between the requirements of a "tight path" for high thermal conductivity and a "loose path" for mechanical compliance of the cooling system element.

Additional prior art concerns the use of cold plates to transfer heat between a cooling fluid and electronic components. Typically a cold plate consists of a thick metal plate with fluid flowing metal piping bonded to the back side of the plate. Heat producing electronic components are thermally coupled to the front side of the plate. The thermal coupling is enhanced by the use of a thermally conductive material disposed between the components and the plate such a material is thermally conducting fine grains dispersed in grease or silicone.

Another cold plate construction includes a thick copper plate with water flow passages machined directly into the plate. The passages are closed by an additional plate bonded to the machined plate.

Typically, electronic components are individually mounted on the cold plate and each component has a relatively flexible electrical connection to other components. In other cases, the components are first assembled on a single circuit board. Then the circuit board and component assembly are urged into intimate contact with the cold plate. Cold plates have limitations in cooling multichip modules. There is a design conflict between a tight path needed for good thermal contact, and a loose path needed to protect the electrical connections of the components to the rigid substrate.

Flexible versions of a cold plate exist, for instance, in the form of a metal sheet with a plurality of flexible metal bellows, one bellows associated with each component to be cooled. A thermal joint couples the bellows to a respective electronic component. Fluid jets flow through each bellows to remove the heat transferred from the component. In order to provide good heat transfer, each fluid jet requires considerable flow. Therefore, small pipes are used to connect the flow in series from bellows to bellows. The drawback to a multiple bellows cold plate is the requirement of construction involving considerable labor and cost and the assembly and bond lines are vulnerable to fluid leakage. If many electronic components are located in close proximity to each other, the assembly and bonding process becomes more difficult. Additionally, the fluid flow system through the corrugated bellows requires considerable fluid pressure.

U.S. Pat. No. 4,730,666 issued to Flint et al, (particularly in FIGS. 3, 9 and 10), teaches a cooling hat. The front layer of the cooling hat is a large flexible metal sheet which includes fins and grooves for enhanced heat transfer.

There is also prior art in the field of fluid logic systems and their construction. Fluid logic gates have been devised which can be constructed from cavities and passages in plates. These plates can be efficiently fabricated by molding or chemical machining. A single plate can have many such gates connected together. By laminating multiple plates, it is possible to construct large fluid logic systems. The construction produces an "integrated circuit for fluid logic" often abbreviated "fluid-IC". The fluid-IC construction facilitates manufacturability of fluid logic.

The present invention concerns a cooling structure which provides excellent heat transfer between electronic components such as integrated circuit chips and a flowing coolant, particularly water, as well as excellent manufacturability and low cost fabrication and assembly. The cooling hat also provides compensation for manufacturing variations in substrate height, tilt, curvature and camber. Depending on the application, there may also be manufacturing variations of chip height and chip tilt as well as thermally induced distortions. The invention also reduces stress on electronic connections between a chip and a substrate, particularly stress caused by the manufacturing variations listed above. The cooling is achieved by using an ample coolant flow with a low pressure drop with the coolant reliably sealed from the electronic components.

The term "compliance" will be understood to refer to "compensation for variations" and "reducing stress" of the components to be cooled and the cooling system itself.

The following description and drawings refer to water cooling for integrated circuit chips mounted on a horizontal printed circuit board or substrate. However, the invention also applies to other electronic components, substrate orientations, and fluids, as well as to transferring heat between non-electronic components. For example, the invention is applicable to cooling individually packaged chips on a printed circuit card or board. The invention is also useful for transferring heat from a hot fluid to cool components.

Patent applications entitled "Thermal Joint" and "Convection Transfer System", assigned to the same assignee as the present application, also concerning heat transfer and cooling are being filed concurrently with the present application and are incorporated herein by reference.

SUMMARY OF THE INVENTION

The invention concerns a cooling hat, which typically includes a coldsheet, several manifold layers, springs, and an exterior shell, used in conjunction with a thermal joint to remove heat from a heated component.

The coldsheet typically is a thin metal sheet with narrow fins and grooves in the area where coolant flows. Since the grooves are narrow, the coolant has a thin thermal boundary layer. The fins and grooves multiply the effective heat transfer area. In addition to improving heat transfer, the coldsheet separates the coolant from the components to be cooled. Alternatively, a fin-less coldsheet may be used where the coolant flows through a gap adjacent to the coldsheet.

Good heat transfer requires ample coolant flow to convect the heat from the warm component. Generally, long narrow grooves require considerable pressure to pump coolant along the full length of the groove. The present invention achieves ample flow with low pressure because the flow is made highly parallel and streamlined.

The manifold consist of tiers of conduits, topologically in the form of a branched hierarchy. A preferred manifold system includes a very large supply port, several large supply ducts, each oriented in the same direction, many intermediate supply channels, each disposed in a direction normal to the direction of the larger supply ducts, very many small supply capillaries, each disposed in a direction parallel to the direction of the larger supply ducts, myriad fine grooves or in gaps along the coldsheet, each disposed in a direction parallel to the direction of the intermediate supply channel, very many small return capillaries, each disposed in a direction parallel to the direction of the supply capillaries, many intermediate return channels, each disposed in a direction parallel to the direction of the intermediate supply channel, several large return ducts, each disposed in a direction parallel to the large supply ducts and a very large return port.

The term "supply" refers to conduits located on the flow path between the coolant source and a workpiece to be cooled and the term "return" refers to conduits located in the flow path between the workpiece to be cooled and the coolant reservoir.

Between piers of adjacent conduits, there is a checkerboard pattern of vias connecting supply conduits to supply conduits, and return conduits to return conduit. The vias do not connect supply conduits to return conduits. The manifold typically is constructed as several layers, each containing alternating supply and return conduits layer. A thin layer forms the capillaries. An intermediate layer forms the channels. A thick layer forms the ducts. Each layer typically is molded as a single piece of synthetic rubber.

In order to achieve ample flow at low pressure also requires conserving hydraulic momentum. Changing flow cross section generally changes fluid speed and wastes momentum. To prevent this, the flow speed is maintained as uniform as practical. The term "total supply cross section in a tier" refers to the product of the area of each supply conduit multiplied by the quantity of topologically parallel flow segments in the tier. The term "total return cross section in a tier" is defined similarly concerning return conduits. The total flow cross section is approximately uniform in the grooves, capillaries, channels (when both the number and size of each tier of conduits is considered). The ducts are tapered to minimize an unavoidable change in cross section from manifold to ports. The tapering matches the graded flow along each duct. Since eddies waste hydraulic momentum, the transitions and bends are streamlined in the ducts and ports.

A shell encases and protects the cooling system and urges the springs against the manifold layers. A gentle force urges the manifold, the coldsheet, the thermal joint, the chip, and the substrate into forced contact with one another.

The cooling hat is designed to bend slightly in order to counteract substrate curvature and camber. The coldsheet is medium thin (or thinner), and hence is inherently semiflexible. The manifold layers are fabricated form a soft material, and hence are bendable. The bending occurs without creating large stresses.

Within the cooling hat, fabrication and assembly dimensions and tolerances are not critical. The two mutually orthogonal structures are horizontally self aligned. The mating surfaces between adjoining layers are in horizontal planes and thus are vertically self aligned.

The coldsheet and manifold layers each are 'global'; namely, each coldsheet and manifold layer is for cooling all the chips on the substrates. In the case of a particularly large substrate, the coldsheet and manifold layer will be used with a plurality of chips but not necessarily all the chips. Still there are only a few cooling hat pieces, in contrast with the many chips on the substrate. After a mold is made, the corresponding manifold layer is fabricated with little additional labor. Self alignment compensates for layer tolerances. The result is a cooling hat which is highly manufacturable.

Any thermal joint must readily conduct heat from each integrated circuit chip to the coldsheet. The thermal joint allows assembly and (if necessary) rework and reassembly between the cooling hat and the chips. In some cases, the thermal joint results in the avoidance of stress and damage due to chip tilt and height variations or lateral thermal distortions. The present invention can be used with any thermal joint that fulfills these functions.

In both structure and construction, the present invention is similar to a printed circuit or integrated circuit for fluids. The cooling hat provides heat transfer, manufacturability, sealing and low pressure in addition to compensation for variations of overall substrate height, tilt, bowing and camber.

The cooling hat provides limited compliance for variations in height and tilt of individual chips and almost no compliance for lateral thermal distortions. If an application requires compliance in these modes, such compliance should be accomplished by the thermal joint design.

A principal object of the present invention is therefore the provision of a cooling structure including a manifold comprising a plurality of tiers of conduits.

Another object of the present invention is the provision of a cooling structure having streamlined coolant flow with parallel topology for transferring heat.

Further objects of the invention will become more clearly apparent when the following description is read in conjunction with the accompanying drawings.

BRIEF DESCRIPTION OF THE DRAWINGS

FIG. 9A is a top plan view of a channel sheet;

FIG. 13 is a side elevation view of another preferred embodiment of the invention illustrating global substrate tilt and offset compliance;

FIG. 16A is a side elevation, parts in section, view of an alternative preferred embodiment of the invention;

FIG. 16B is the embodiment shown in FIG. 16A with the coldsheet having a personalized pattern of fins and grooves.

FIG. 20 is a side elevation view of a preferred embodiment of the invention for use with a chemically inert coolant;

FIG. 21C is a plan view of the cooling hat shown in FIG. 21A; and

DETAILED DESCRIPTION

Figure 1:
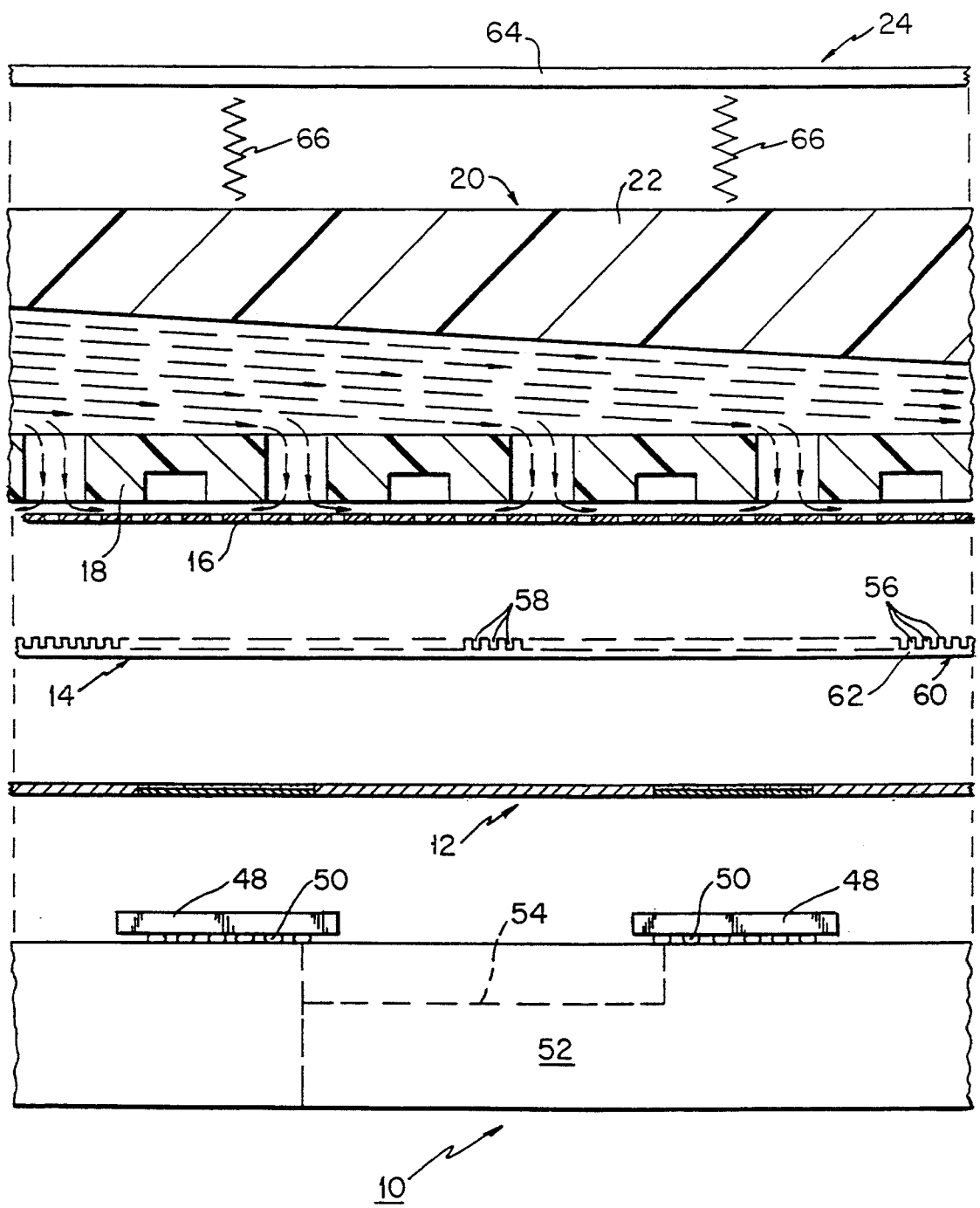
FIG. 1 is a side elevation, partly in section, view of a preferred embodiment of the present invention.

Referring to the figures and to FIG. 1 in particular, there is shown the principal portions of a preferred embodiment of the invention. The principal portions are the electronics assembly 10, thermal joint 12, coldsheet 14, capillary sheet 16, channel sheet 18, duct block 20, ports 22, external parts 24, and coolant fluid. Each portion will be described in detail below.

The electronic assembly 10 in FIG. 1 includes a plurality of integrated circuit chips 48 having electrical connections 50 to a substrate 52 which contains printed circuit wiring 54.

Thermal joint 12 conducts heat from each chip 48 to the coldsheet 14 of the cold hat. Different thermal joints as is known in the art can be used.

Coldsheet 14 includes a plurality of fins 56 which are shown in elevation views in FIGS. 1, 4, 5, 6 and 7. Above coldsheet 14 in the figures there are fine fins 56 and fine grooves 58. Heat conducts into the bottom surface 60 of the coolant and through a foot 62 up the fine fins 56 and convects into the fine groove 58 where it is removed by a coolant flowing through the grooves. For best results, fine, thin rectangular fins spaced close together are used.

Another embodiment uses a fin-less coldsheet. A facesheet containing supply nozzles and return nozzles is disposed opposite (and above when a coldsheet is oriented as shown in the figures) the coldsheet, a spacer or other means is used for dimensioning a gap between the coldsheet and facesheet. The coolant fluid flows through the gap between the coldsheet and facesheet. Also, the coldsheet may be locally flat, or may have a texture or structures to promote fluid stirring and heat transfer.

Depending upon the embodiment, the facesheet may be distinct from, merge, align or coincide with the capillary sheet, channel sheet or duct block.

External parts are seen in elevation views in FIG. 1 and FIGS. 4 through 7. The external parts include a shell 64 which compresses springs 66. The result is a gentle, predictable compression which forces the duct block 20 against the channel sheet 18 which, in turn, is urged against the capillary sheet 16, coldsheet 14, thermal joint 12 and the electronics assembly 10. The shell encases and shields the overall cooling system.

Figure 2:
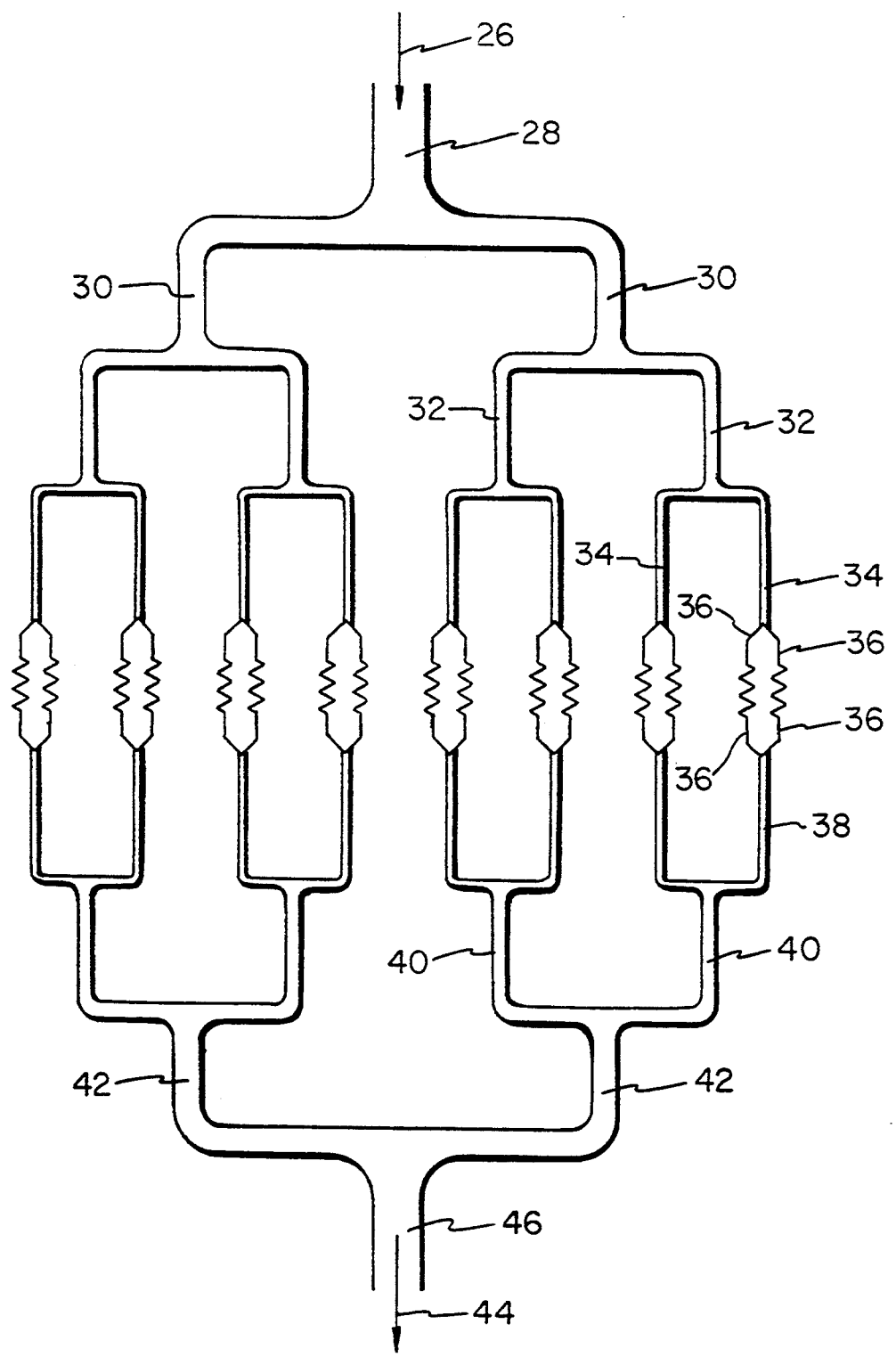
FIG. 2 is a schematic representation of the topology of fluid flow.

FIG. 2 is simplified schematic representation of the topology of the fluid flow. Coolant flows through the system in the following order. Initially, cold supply coolant (indicate by arrow 26) enters through a large supply port 28. The coolant them divides into a plurality (two shown) of supply ducts segments 30. Next, the supply coolant flows in to a channel sheet by means of a plurality of supply channel segments 32. Then the supply coolant flows in a capillary sheet through many supply capillary segments 34. Finally supply coolant flows along the coldsheet (not shown) through myriad fine segments 36 either among grooves and fins in a finned coldsheet, or in gaps along a fin-less coldsheet. The cold supply coolant absorbs heat from the coldsheet and becomes warm return coolant. The return coolant flows in a capillary sheet and through many return capillary segments 38 into a return channel sheet and through a plurality of return channel segments 40 and then in a duct block and through return duct segments 42. Finally, the warm return coolant (indicated at arrow 44) exits the system through a large return port 46. In a closed system, the return coolant is cooled and returned to a reservoir from which the coolant recirculates through the system. For graphic clarity, FIG. 2 has some over-simplifications. For example, FIG. 2 shows a binary tree, but the actual flow topology has different branching ratios. FIG. 2 shows flow in only one plane, but the actual flow is three dimensional. In one aspect of the invention there is synergism between the hydraulic hierarchy of the manifold conduits and the coldsheet. The compliment coldsheet transmits hydrostatic pressure through the thermal joint to the chips and to the electrical connections. In the presence of a large hydraulic pressure the electrical connections tend to fatigue. The hydraulic hierarchy of the present invention prevents such fatigue by permitting ample cooling fluid flow at a modest hydraulic pressure.

Figure 3:
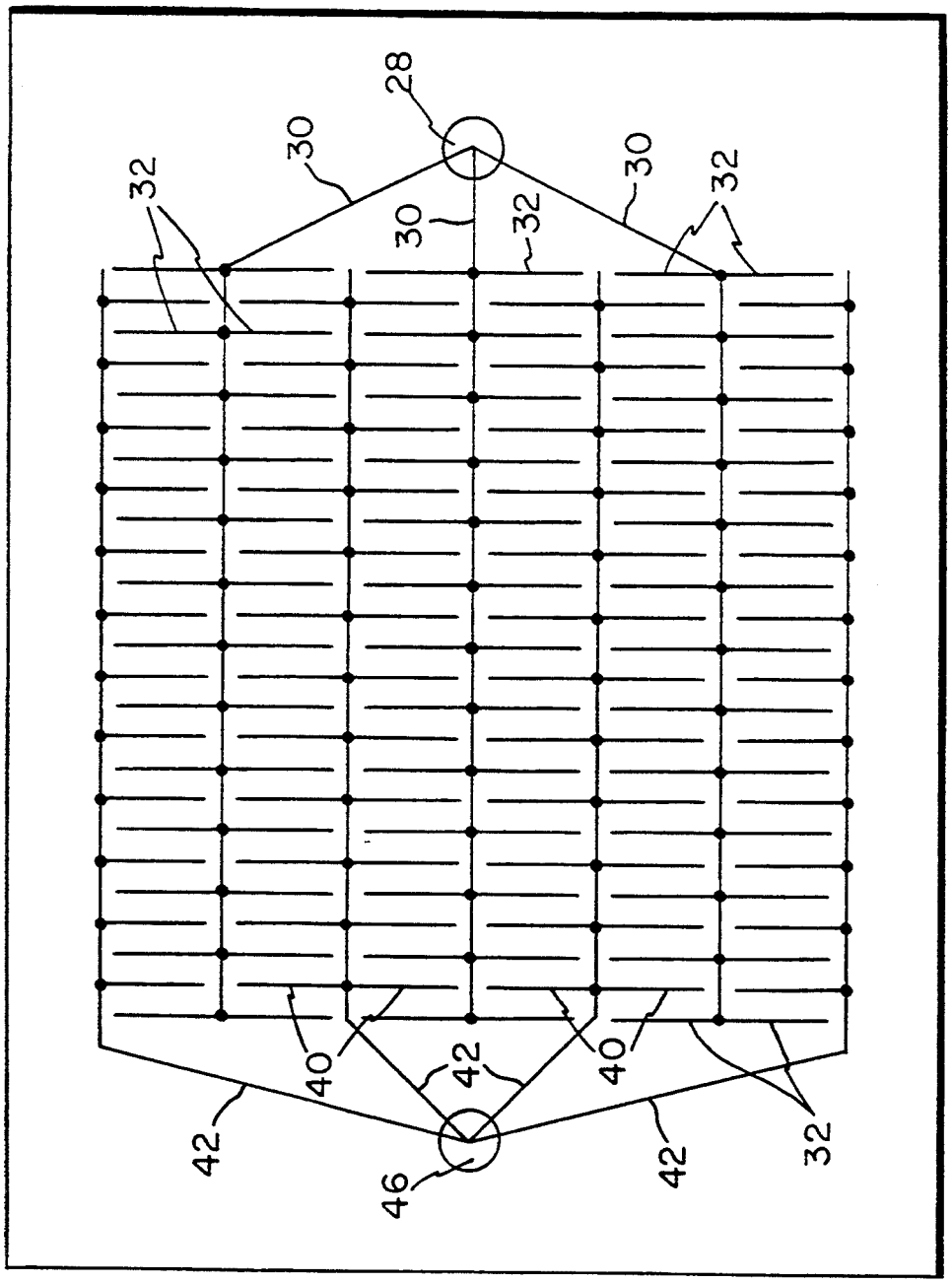
FIG. 3 is a top plan view of a conduit layer.

FIG. 3 shows a topology for the ports, duct and channels, but does not show the capillaries, grooves or gaps. In FIG. 3 the topological branching for a preferred embodiment is shown and the geometry approximates a preferred embodiment. The projection of the branching topology onto a horizontal plane will be discussed below. The supply ducts 30 are in a different vertical plane from the supply channels 32 to which the supply ducts are connected. The supply ducts do not connect to the return channels 40. The non-connection is represented by a break in the line of the return channel. For clarity sake, this FIG. 3 does not show the capillaries or grooves. The supply port 28 and return port 46 are perpendicular to the plane of the figure.

FIGS. 3 through 11 show different views and portions of the same embodiment of a cooling hat.

Figure 4:
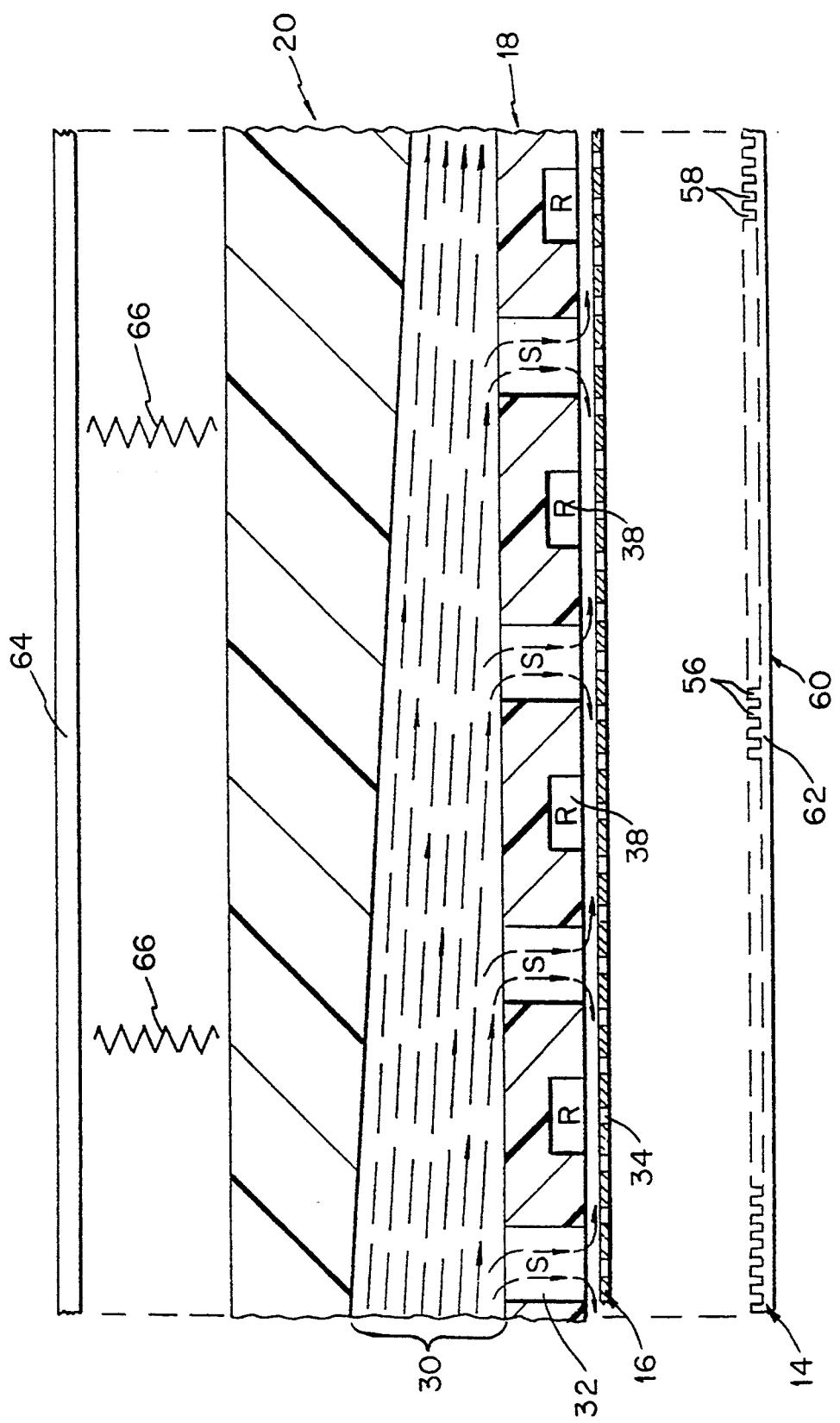
FIG. 4 is a side elevation, partly in section, view through a supply duct and capillary of a cooling hat useful for practicing the present invention.
Figure 5:
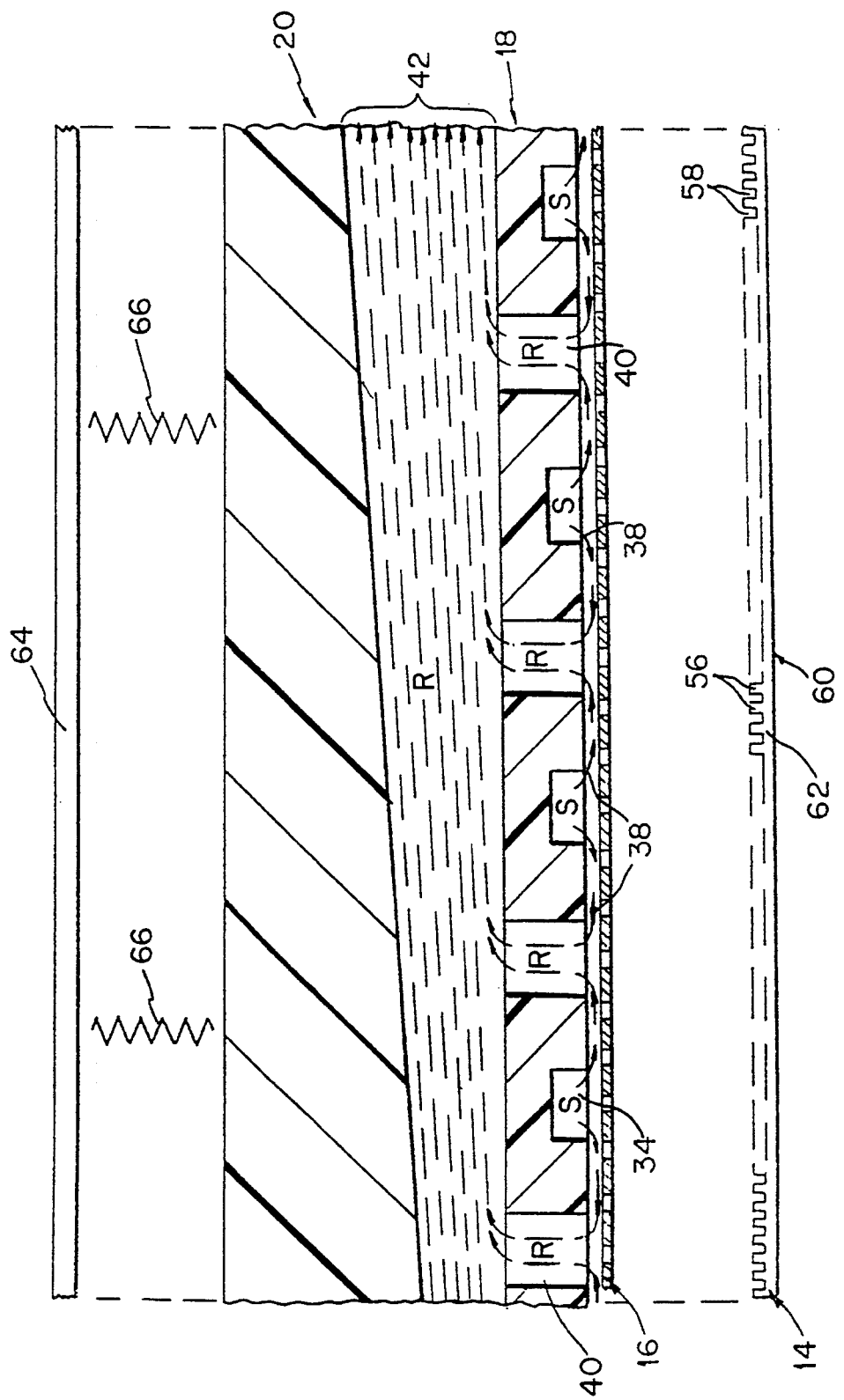
FIG. 5 is a side elevation, partly in section, view through return duct and capillary view of a cooling hat useful for practicing the present invention.
Figure 6:
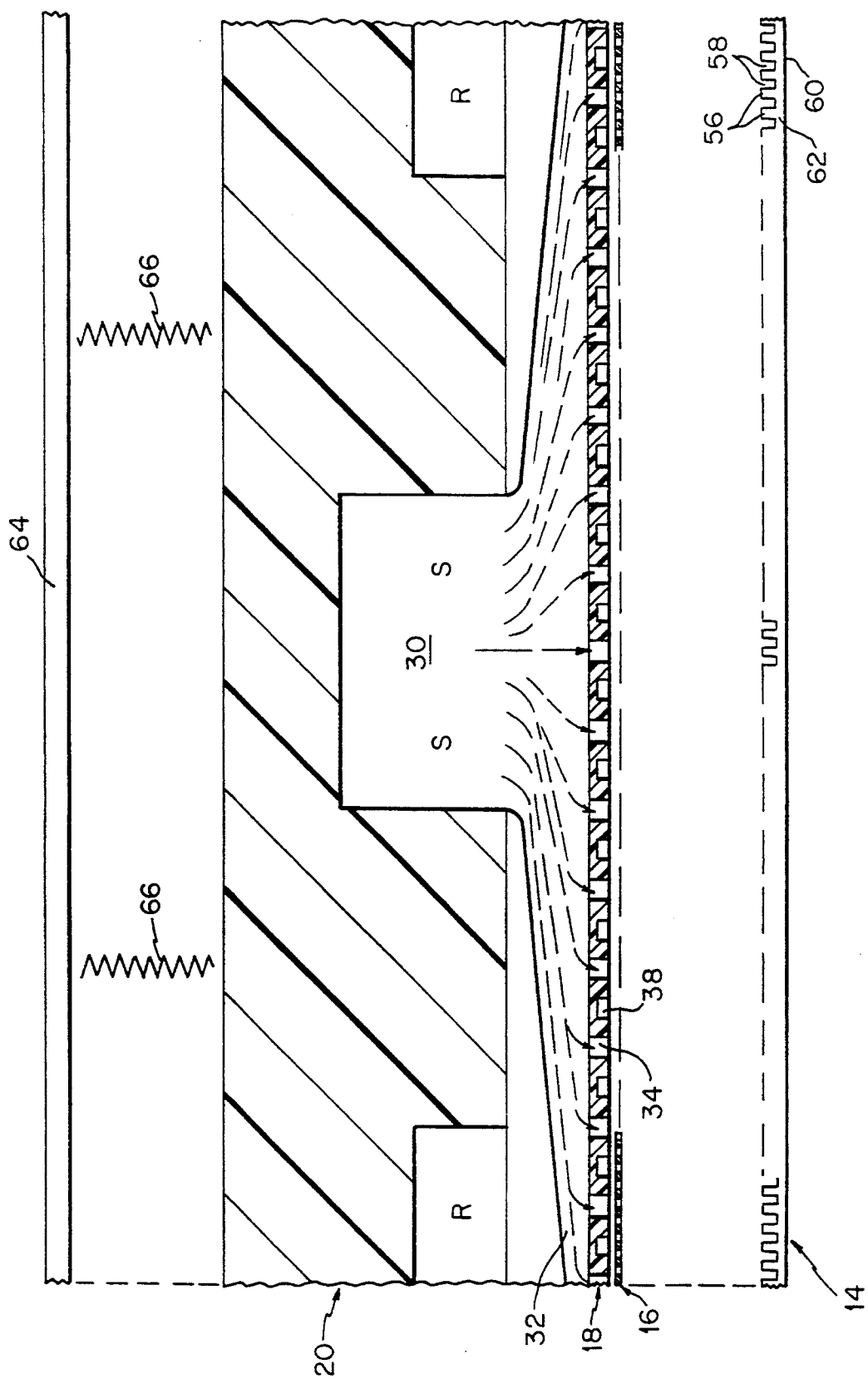
FIG. 6 is a side elevation, partly in section, view through a supply channel of a cooling hat useful for practicing the present invention.
Figure 7:
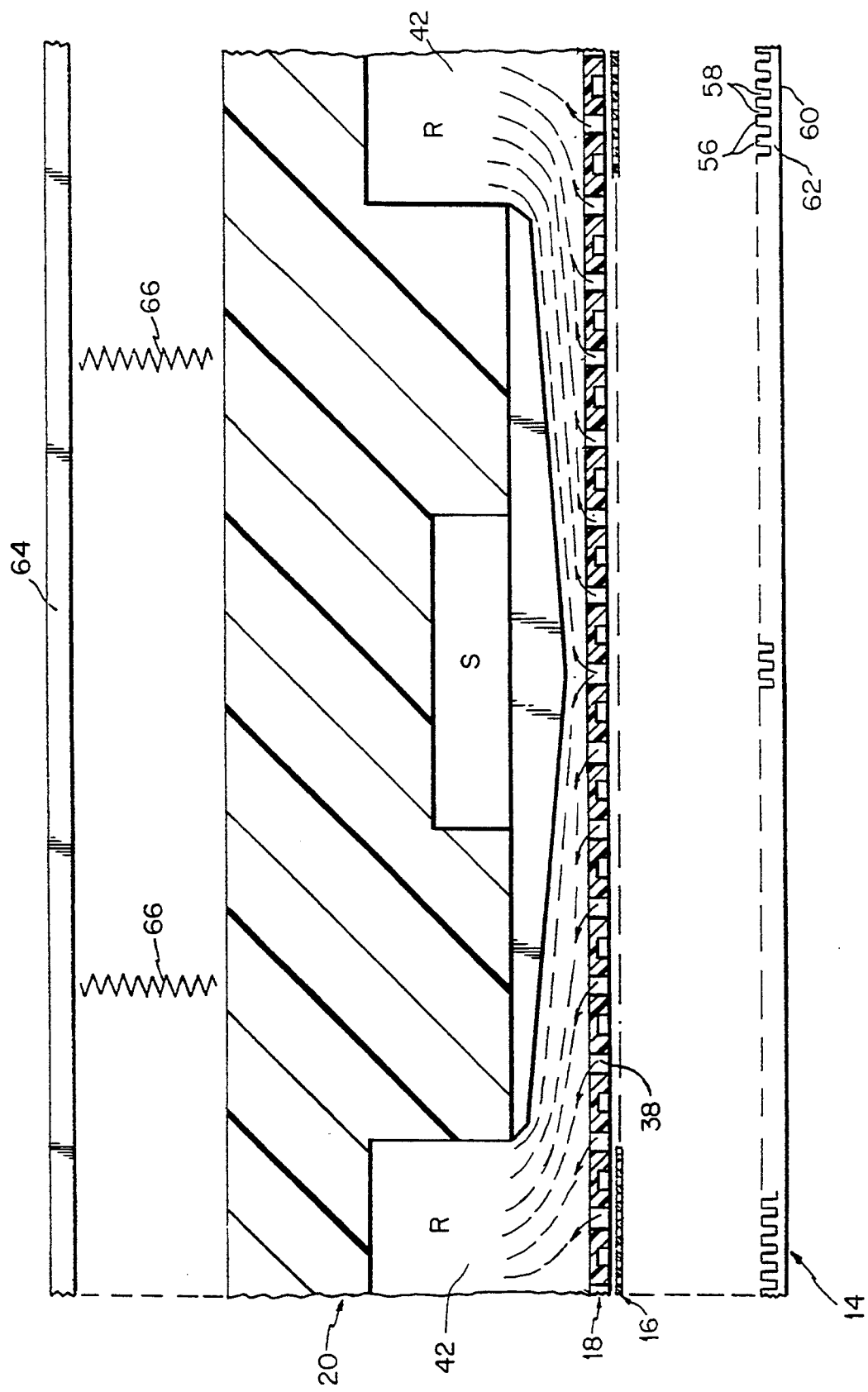
FIG. 7 is a side elevation, partly in section, view through a return channel of a cooling hat useful for practicing the present invention.

The channel sheet is seen best in elevation views in FIGS. 4 and 5 and in topological views in FIGS. 2 and 3, and is partly seen in FIGS. 1, 6 and 7. In FIG. 4, the supply coolant flows through supply channel vias 30 to each supply channel 32. Then the coolant flows though the supply capillaries 34, coldsheet grooves 58, return capillaries 38 as described above. In FIG. 5, the return coolant flows through return channels 40 through return channel vias 42.

Capillary sheet 16 is best seen in elevation views in FIGS. 6 and 7. In FIG. 6 the return coolant flows through a return capillary 38 to a return via 42.

The duct block is seen best in elevation views in FIGS. 6 and 7, topological views in FIGS. 2 and 3, and is partly seen in elevation views in FIGS. 1, 4 and 5. In FIG. 6, the supply coolant flows through a supply duct 30, through supply channels 32, supply capillaries 34, coldsheet grooves 58, return capillaries 38 and return channels 40 as described above. In FIG. 7, the return coolant flows out through return duct 42.

Figure 8B:
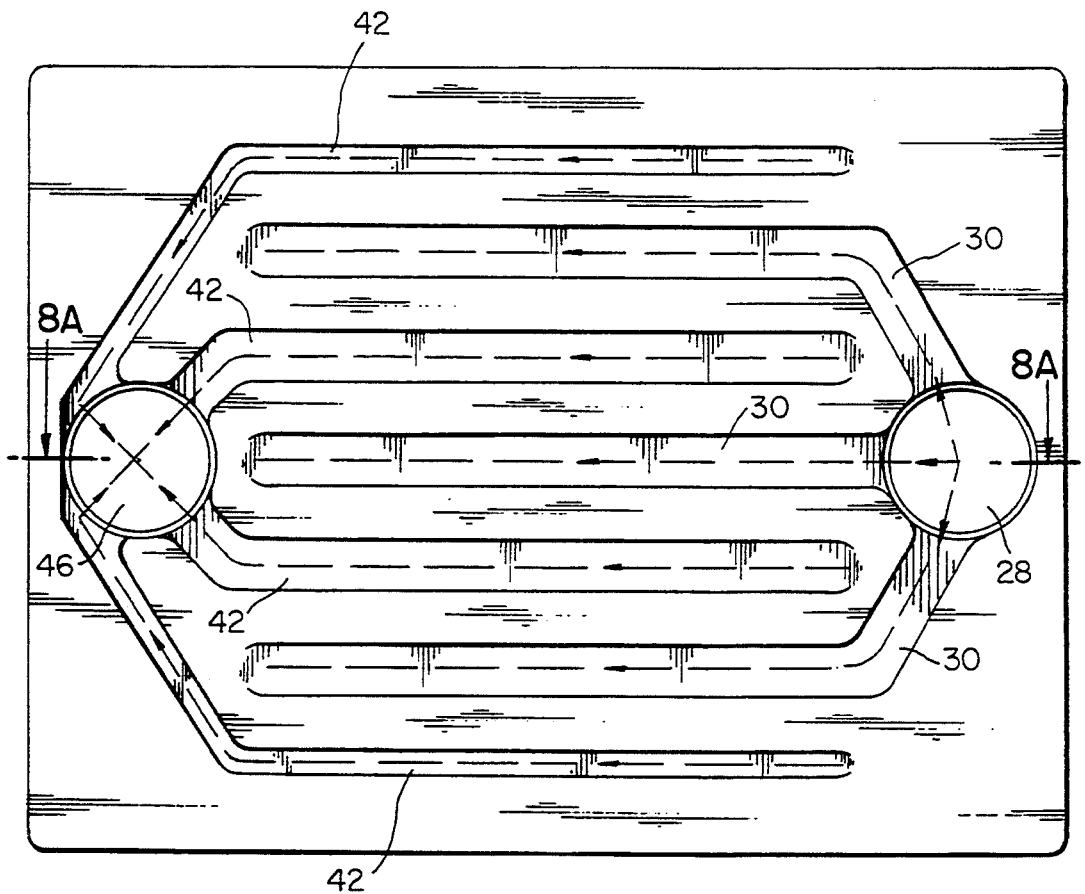
FIG. 8B is a bottom plan view of a duct block with ports.
Figure 8A:
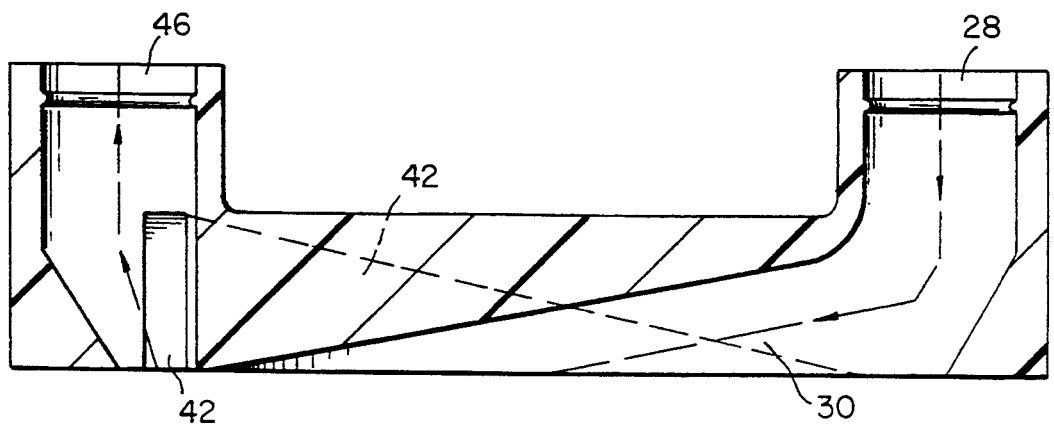
FIG. 8A is a cross sectional view of a duct block with ports taken along line 8A—8A of FIG. 8.
Figure 9B:
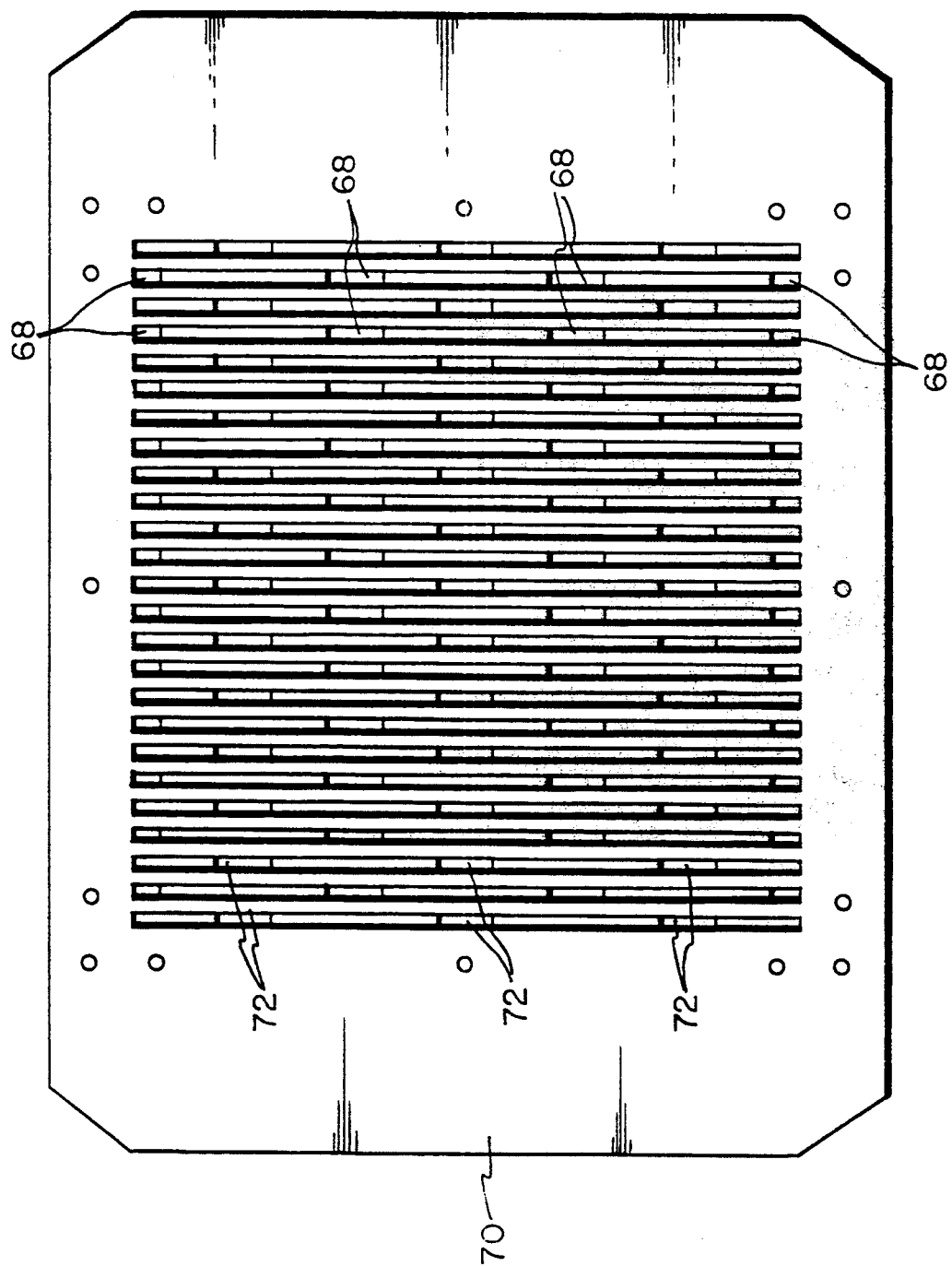
FIG. 9B is a bottom plan view of channel sheet.

The supply port 28 and return port 46 are seen in elevation view in FIG. 8A and in plan view FIG. 8B, and topological views in FIGS. 2 and 3. The supply coolant flows sequentially through the supply port 28, supply ducts 30, supply channels, supply capillaries, coldsheet grooves, return capillaries, return channels, return ducts 42 as described above. The return coolant leaves the system through the return port 46.

As used in the following description of the invention, "tier" means all conduits of a single size and a single polarity (supply or return). Thus the supply ports, supply ducts, supply channels, supply capillaries, grooves, return capillaries, return channels, return ducts, return ports are each a separate tier. A "via" connects fluid flow between tiers. "Manifold" refers collectively to the capillary sheet, channel sheet, duct block, and ports. "Flow topology" refers to the flow through all tiers and vias.

Coolant flows through vias between a larger tier of conduits and a smaller tier of conduits. Each conduit has vias, and each via is a vertex in the flow between a larger conduit and multiple smaller conduits. Supply vias connect supply conduits to supply conduits in adjacent tiers and return vias connect return conduits to return conduits in adjacent tiers. The only flow connection between supply conduit and return conduit is through the grooves located adjacent to the coldsheet.

In FIG. 6, the supply coolant flows from a supply channel 30, through the capillary supply via 34, into the supply capillary 36. An analogous pattern occurs in channels, capillaries, grooves, both for supply coolant and for return coolant.

Figure 10A:
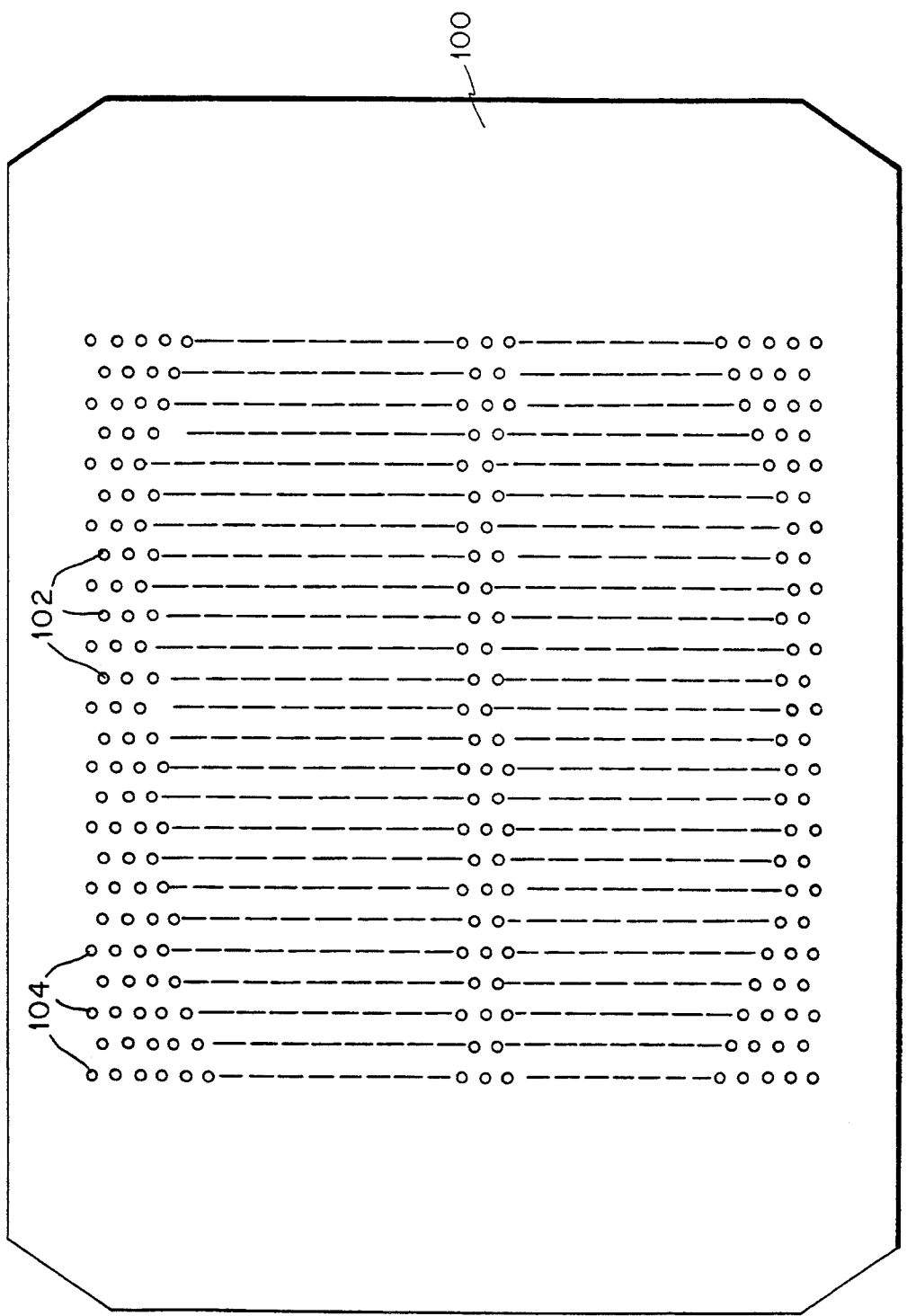
FIG. 10A is a top plan view of a capillary sheet.
Figure 10B:
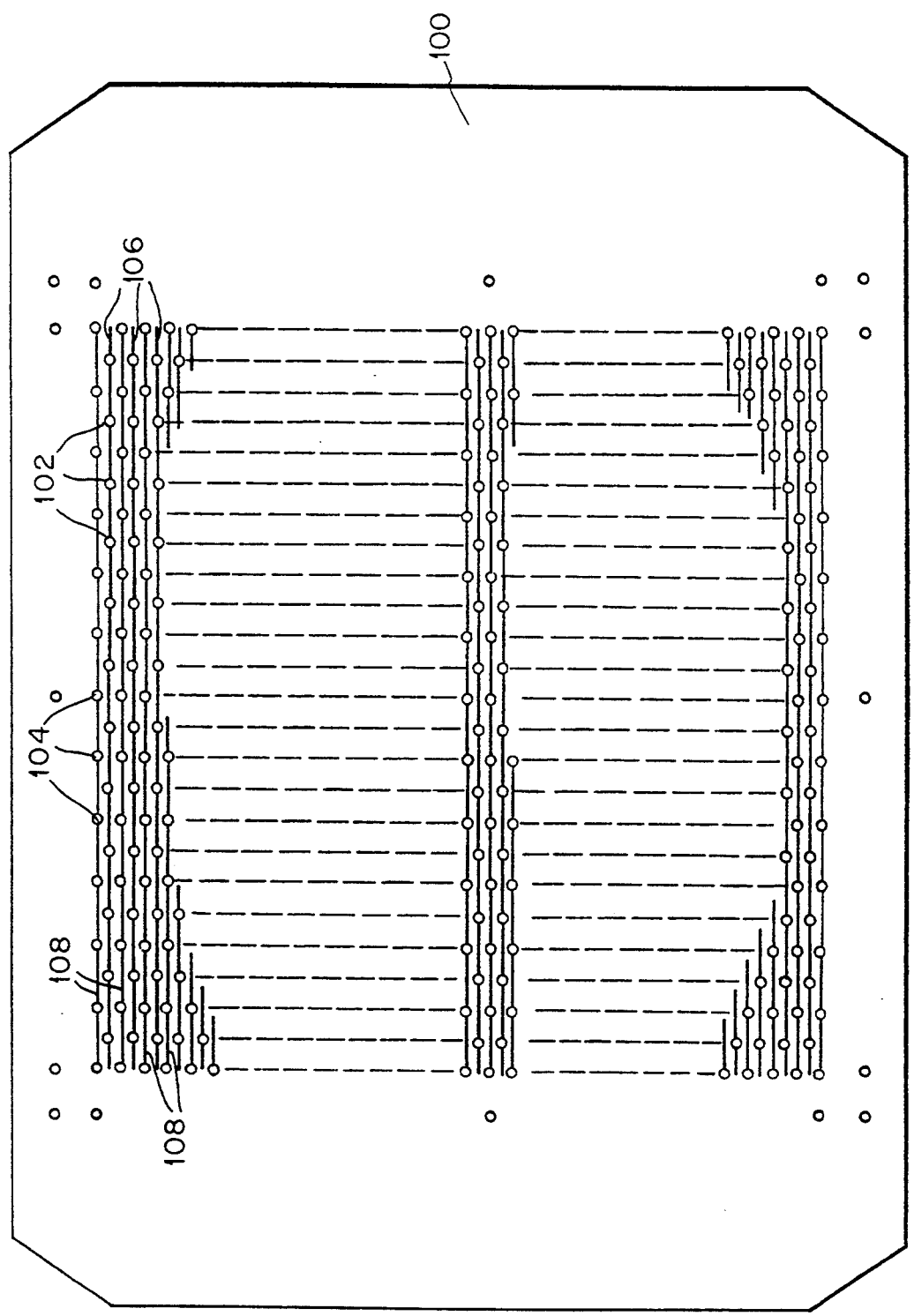
FIG. 10B is a bottom plan view of a capillary sheet.

Vias are also shown in plan views in FIGS. 9A, 9B, 10A and 10B. The channel supply vias 68 form a checkerboard pattern in the supply channel sheet 70, as seen in plan view in FIG. 9A. The channel return vias 72 form a complementary checkerboard pattern in the channel sheet 70. In FIGS. 10A and 10B, the capillary sheet has a finer scale but analogous pattern of vias.

In a preferred embodiment, a substrate has an electronically active area of 51 mm by 51 mm. There are 36 integrated circuit chips, each sized 4.5 mm by 4.5 mm, forming a 6 by 6 array, with a pitch of 8.5 mm by 8.5 mm. In order to cool the electronics assembly, the preferred embodiment of the cooling hat has the following dimensions. Pitch between adjacent conduits: groove pitch=0.05 mm, capillary pitch=0.531 mm=8.5 mm/16, channel pitch=2.125 mm=8.5/4, duct pitch=8.5 mm and ports pitch=approximately 51 mm=8.5 mm×6. All other dimensions are derived from these pitches. The segment length are: grooves=0.531 mm; capillaries=2.125 mm; channels=8.5 mm and ducts=51. mm. Thus the segment length in each tier equals the pitch for the next larger tier. The width of the conduits are: grooves=0.025 mm, capillaries=0.265 mm, channels=1.0625 mm and ducts=4.25 mm. Thus the conduit width in a tier equals half the pitch in that tier. The height of the conduits are: grooves=0.1 mm; capillaries=0.4 mm; channels=1.5 mm and ducts taper from 10 mm to 0. Each port is round with a diameter of 12.7 mm. The height is discussed below in connection with streamlining.

The system achieves optimal heat transfer, reliable sealing, and low stress. Therefore, it is desirable to achieve ample flow with a small differential pressure. The pressure versus flow curve has two terms. Viscous drag which increases linearly with flow and is due largely to drag in the fine grooves. Inertial drag which increases quadratically with flow and is due largely to changes in hydraulic momentum, either by changing flow speed or by the forming of eddies. The grooves are narrow and the coldsheet is large. Therefore, if ample coolant were directly pumped along the full length of the coldsheet considerable pressure would be required. Instead, the flow topology described above makes the flow parallel. Thus considerable flow density requires only a small differential pressure.

In a flowing system, non-uniform flow speed generally wastes hydraulic momentum density, which causes inertial drag. For example, a corrugated bellow has a non-uniform flow cross section. Thus flow through the bellow has considerably large inertial drag.

To minimize inertial drag, the total flow speed should be as uniform as practical. In an over simplified case, shown in FIG. 2, the total flow cross section and the flow speed are uniform. In the actual embodiment, the width of each conduit is 50 percent of its pitch. Thus the overlap between two tiers of conduits is 25 percent of the cooled cold-sheet area. But only one-quarter of the overlap is between supply conduits and return conduits. Therefore, the supply via area is $\frac{1}{4}$ times $\frac{1}{4}=1/16=6.25$ percent of the coldsheet area. However, when the coolant enters a via, there is a "vena contracta" effect which reduces the effective area to about 4.5 percent.

For each conduit, the flow cross section is about 4.5 percent of the coldsheet area which it serves. Equivalently the total supply cross section for each tier is about 4.5 percent of the total coldsheet area. In the conduits, especially the ducts, the flow rate varies along its length. Therefore, the conduit cross section should taper in proportion to the varying flow rate. This tapering is shown by the ducts in FIGS. 4 and 5, seen less clearly in the channels in FIGS. 6 and 7, and seen clearly again in the supply duct in FIG. 8A.

FIG. 10A shows a top plan view of a channel sheet 100 containing a plurality of rows of supply capillary vias 102 and alternating rows of return capillary vias 104. FIG. 10B show the bottom view of sheet 100 where the supply capillaries 106, and return capillaries 108 are shown as lines and the vias 102, 104 are shown as circles.

Figure 11:
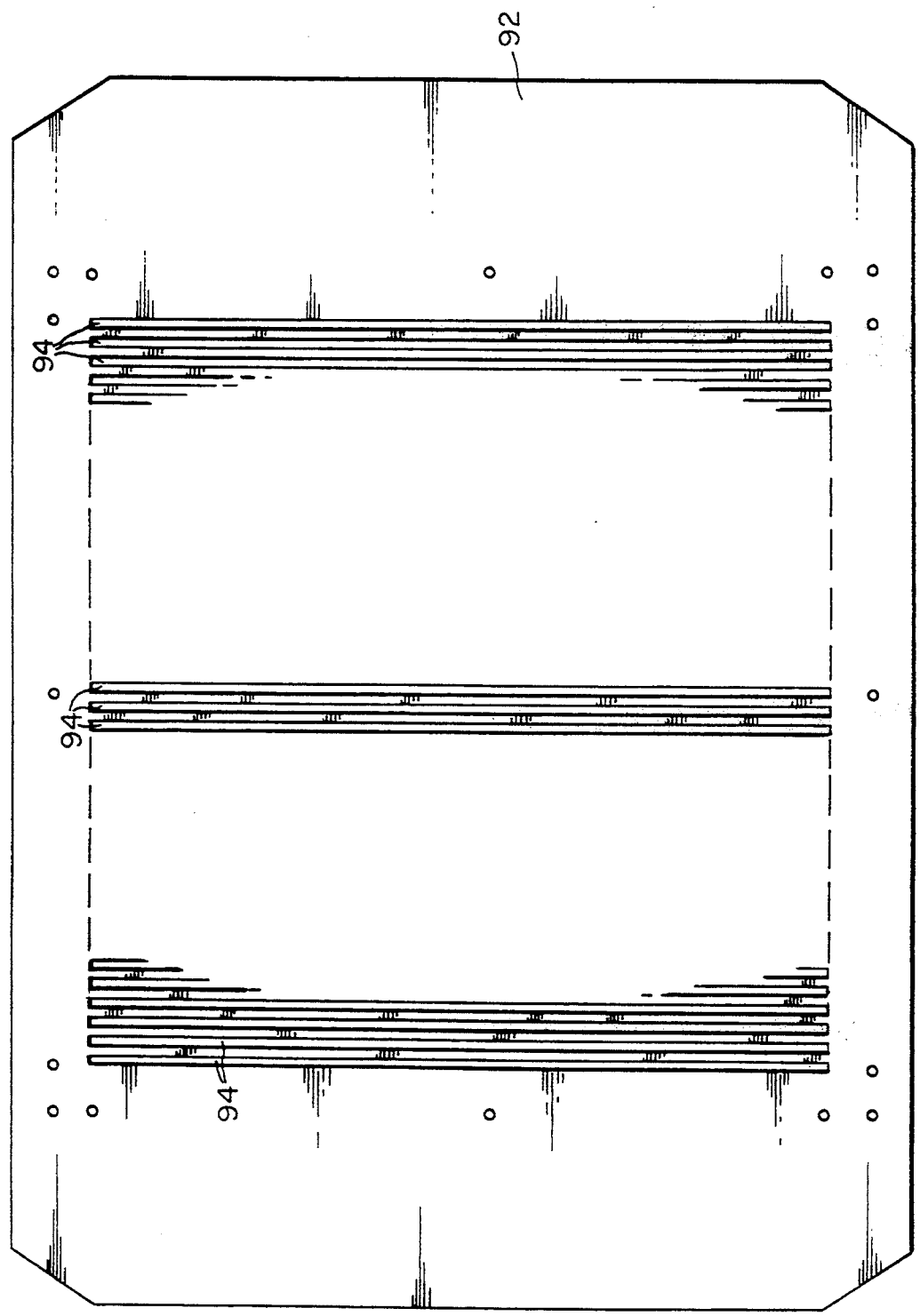
FIG. 11 is a top plan view of a grooved coldsheet.

FIG. 11 is a top plan view of a coldsheet 92 containing closely spaced grooves 94. For graphical clarity, only a portion of the grooves is shown.

Figure 22:
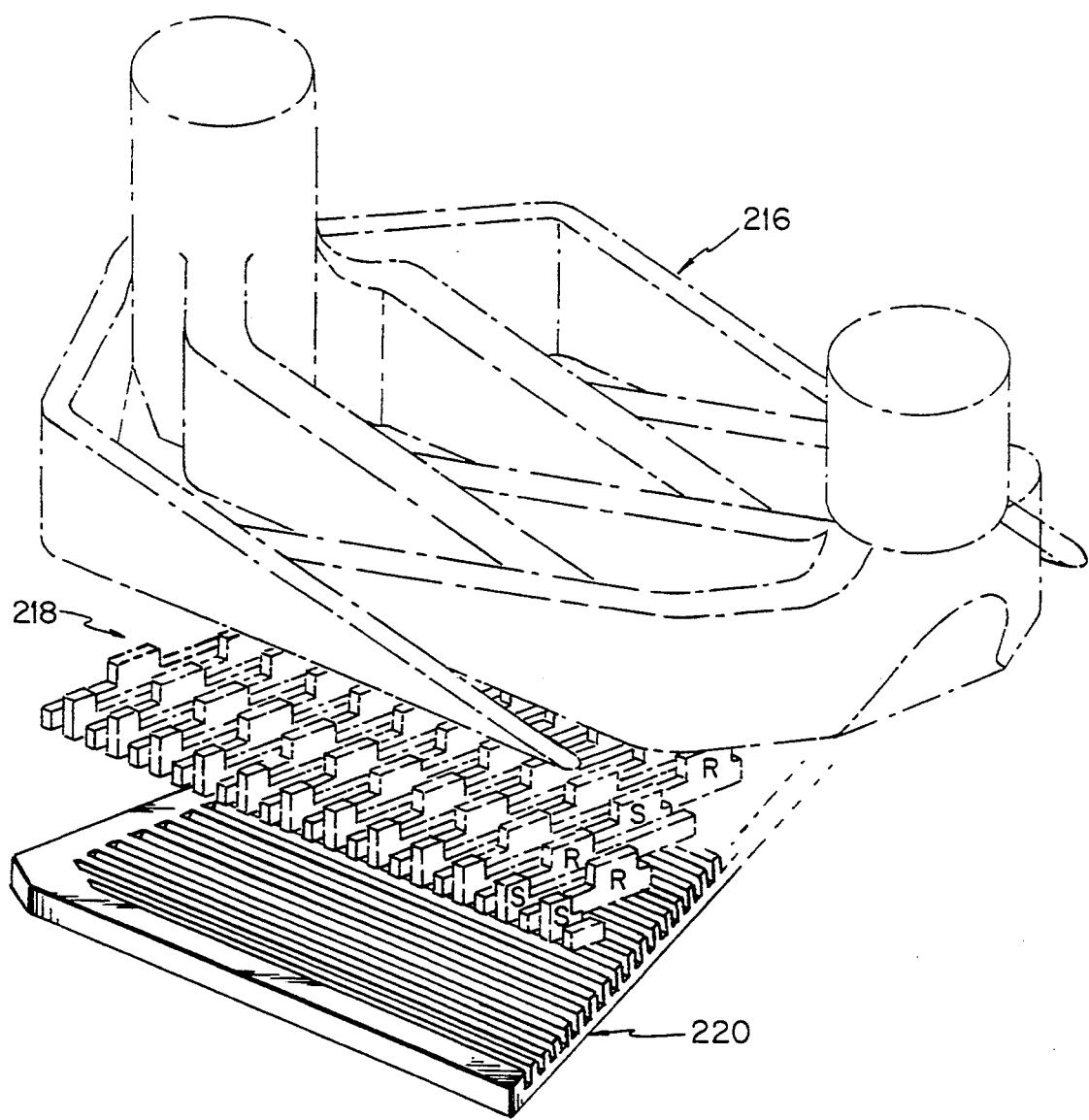
FIG. 22 is a simplified perspective view of a cooling hat.

FIG. 22 is a perspective of a cooling hat. A first tier 216 includes a supply port and a return port with associated duct segments. A second tier 218 includes vias and supply channels and return channels. A third tier 220 includes a coldsheet with fins and grooves. For graphical clarity, the figure does not show the capillaries and exaggerates the dimensions of the fins and grooves. Also, conduits are shown rather than the manifold itself.

Figure 12A:
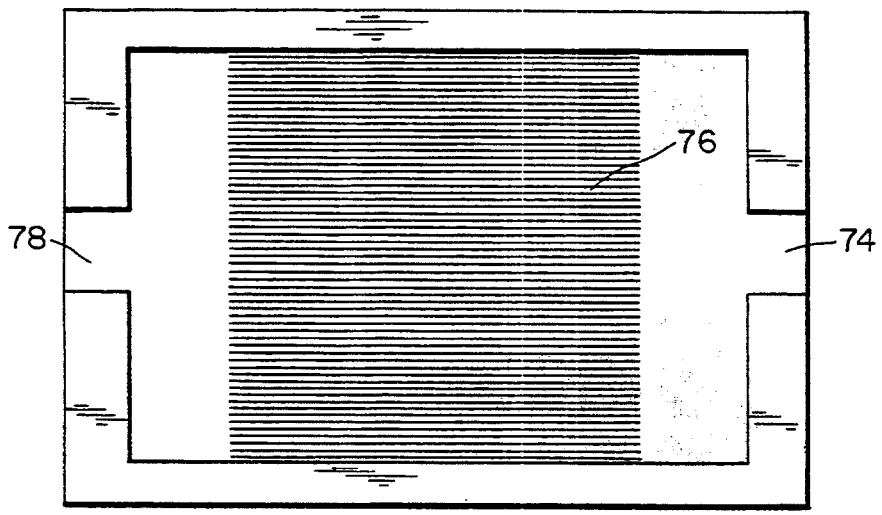
FIGS. 12A, 12B and 12C are top plan views of a fine groove plate illustrating the hydrodynamics of a simplified cold hat.
Figure 12B:
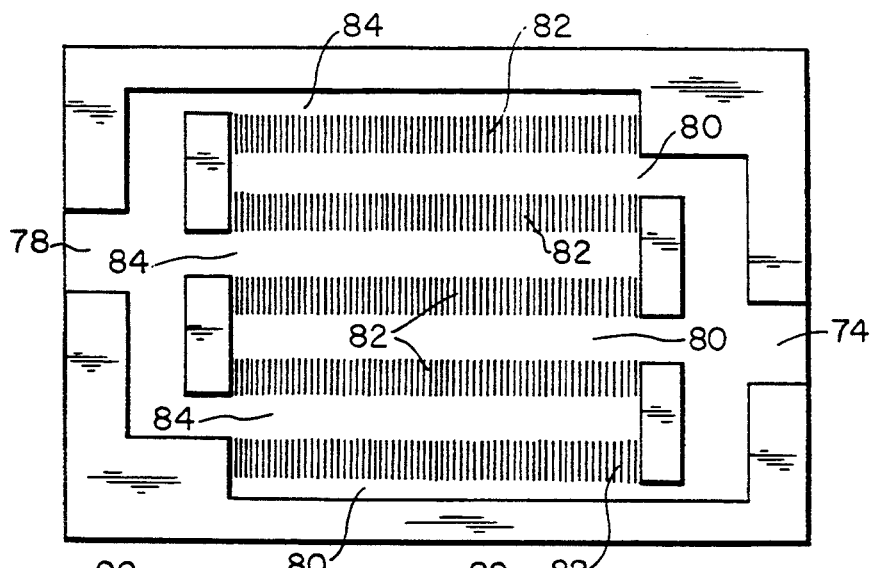
Figure 12C:
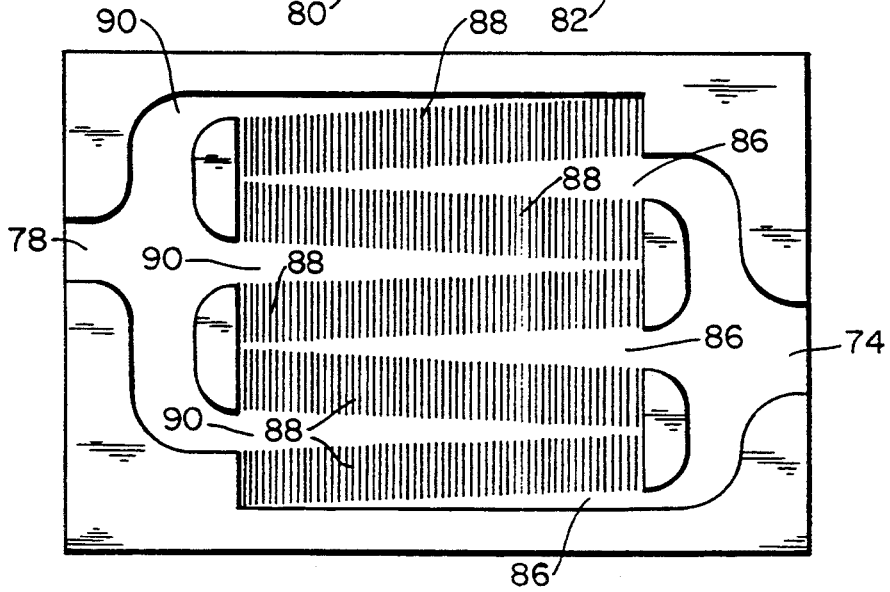

FIGS. 12A, 12B and 12C are schematic presentations of the hydrodynamics of a simplified version of a cooling hat. In FIG. 12A a single supply duct 74 provides fluid to long grooves 76 and then to a single return duct 78. Considerable differential pressure is required to assure adequate flow through the grooves 76. In FIG. 12B a single supply duct 74 provides a flowing fluid to multiple supply channels 80 which provide fluid to multiple short groove segments 82, from which the fluid flows to multiple return channels 84 and then through return duct 78. The viscous drag is reduced compared to the configuration shown in FIG. 12A. However, the arrangement has sharp flow bends which cause eddies and adds quadratic inertial drag. The embodiment shown in FIG. 12C includes tapering and streamlining of the flow through grooves and channels which considerably reduces the quadratic inertial drag. Therefore, the embodiment is FIG. 12C is a preferred structure supply channels 86. The coolant fluid flows from supply duct 74 through tapered short groove segments 88 to return channels 90 and exits via return duct 78. The channels include curved walls for streamlining as contrasted with the walls having corners.

Any eddy formed in the fluid wastes hydraulic power. Therefore, each transition, particularly from hose to port to duct should be streamlined. Misalignment and moldability make it difficult to streamline vias between different layers. Also it is desirable to remove "flash" or excess material from the molded pieces. As the cooling hat is assembled, erosion streamlining may be used.

Erosion streamlining is performed by assembling the manifold layers without any coldsheet. Liquid nitrogen (or a fluid mixed with a fine abrasive) is pumped into the supply port and out the supply capillaries. Also the liquid is pumped backwards into the return port and out the return capillaries. This flow will cause erosion and improve streamlining at the vias. Liquid nitrogen makes a rubber manifold brittle which enhances erosion. Afterwards the system is thoroughly rinsed to remove eroded material (and to remove any possible abrasive). Finally, the coldsheet is attached. The resultant streamlined vias allow an area ratio more closely approaching 6.25 percent. As a result, taller conduits are used to reach the area ratio. Sometimes the hydrodynamic ideals described are not obtained. For instance the total cross section in each tier is made at least as large as the port cross section. Inertial drag is typically dominated by the highest speed and smallest total flow area. Also tapering and streamlining are most important in larger conduits and larger vias. There inertial forces are relatively large, and viscous damping forces are relatively small. Hence the Reynolds' number is relatively large.

If less cooling density is needed, then the flow may be reduced. The viscous drag is linearly reduced and the inertial drag is quadratically reduced. In such instances, the manifold design can vary from the ideal and only a moderately parallel topology is necessary. Likewise, inertial drag and streamlining effects are less significant.

The cooling hat embodiment described above is optimized for water and has large heat capacity, large thermal conductivity and low viscosity. The result is high performance for cooling near room temperature. However other coolants can be used with modification of the geometry. For instance, compared to water, perflurocarbon and other dielectric liquid coolants have lower specific heat. Thus for cooling without boiling, or for cooling using "sub cooling" to supplement boiling, equivalent cooling with dielectric cooling with dielectric liquids requires more flow than water. Cooling many densely packed high power chips, requires good flow topology, cross-sectioning and streamlining.

For high performance, it becomes desirable to increase the flow cross section. The conduit width becomes a larger fraction of the conduit pitch, such as 75 percent, thus the area ratio increases to $0.75 \times 0.75/4 = 14$ percent.

The coldsheet should be medium-thin or thinner for flexibility. The preferred embodiment is a metal sheet, typically about 375 μm thick, with fins and grooves fabricated into the metal by etching or precision cutting. The manifold pieces should be made from soft material, such as molded synthetic rubber. A preferred manifold material is ethylene propylene diene monomer with a peroxide curing agent and without chloride or sulfur. This material is chemically inert in water and its hardness is readily controlled. The manifold layers are joined by "post vulcanization bonding". Thus the rubber acts as its own adhesive, thereby avoids the need for an added adhesive. Alternatively, the manifold can be fabricated using a plastic material.

The coldsheet can be fabricated from metals including molybdenum, stainless steel, copper, titanium, nickel and various metal combinations, either as allows or as layers. Each metal differs in thermal conductivity, stiffness, elastic limit, chemical inertness, and ease of fabrication. It is also possible to fabricate a coldsheet from a chemically etched silicon wafer. However, such an etched silicon wafer coldsheet is brittle and when mounted against a manifold, the etched silicon wafer coldsheet can easily be broken. Therefore, the etched silicon coldsheet is preferably used with a relatively rigid manifold.

Figure 14:
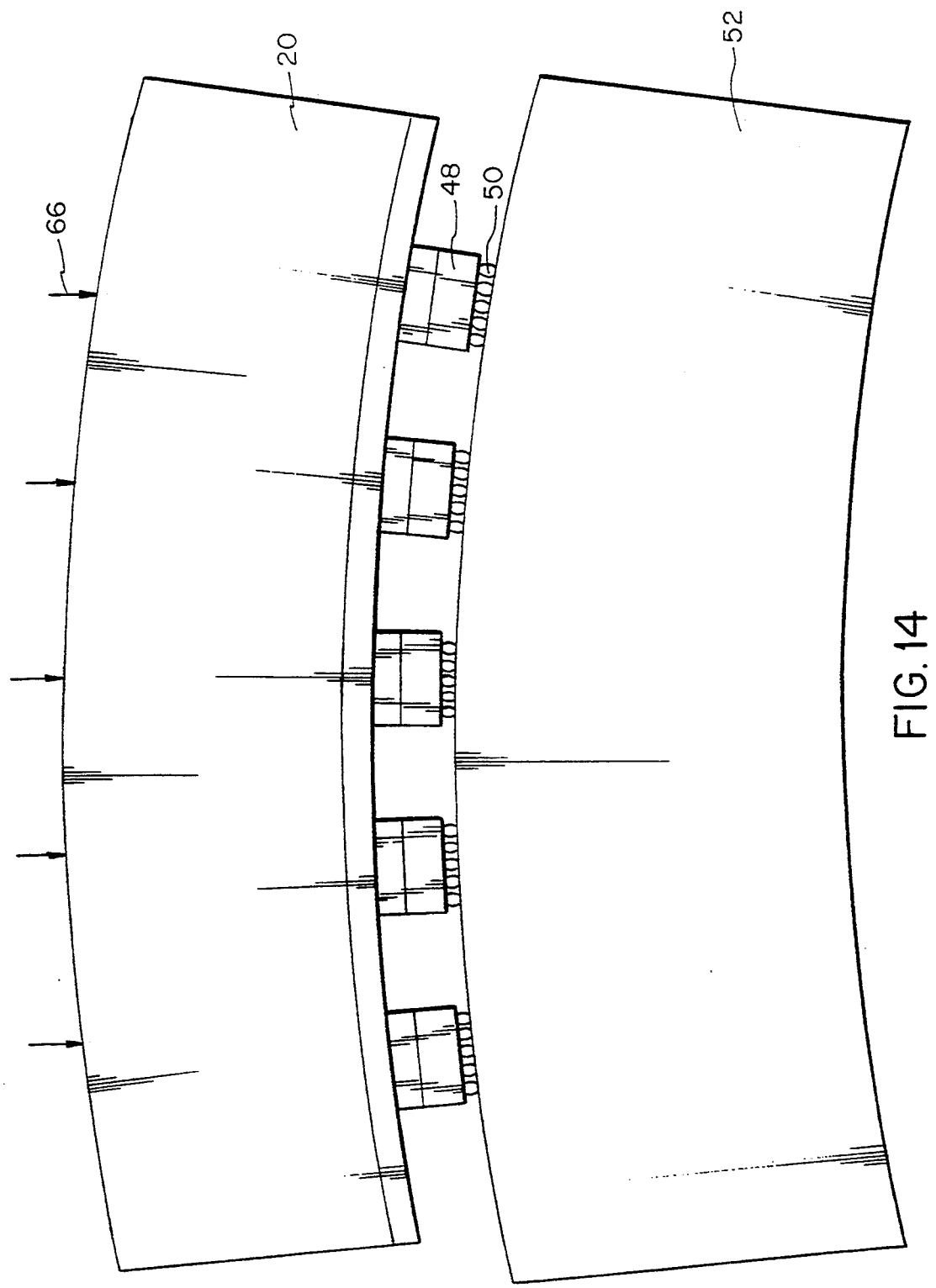
FIG. 14 is a side elevation view of a further preferred embodiment of the invention illustrating global substrate curvature compliance.
Figure 15:
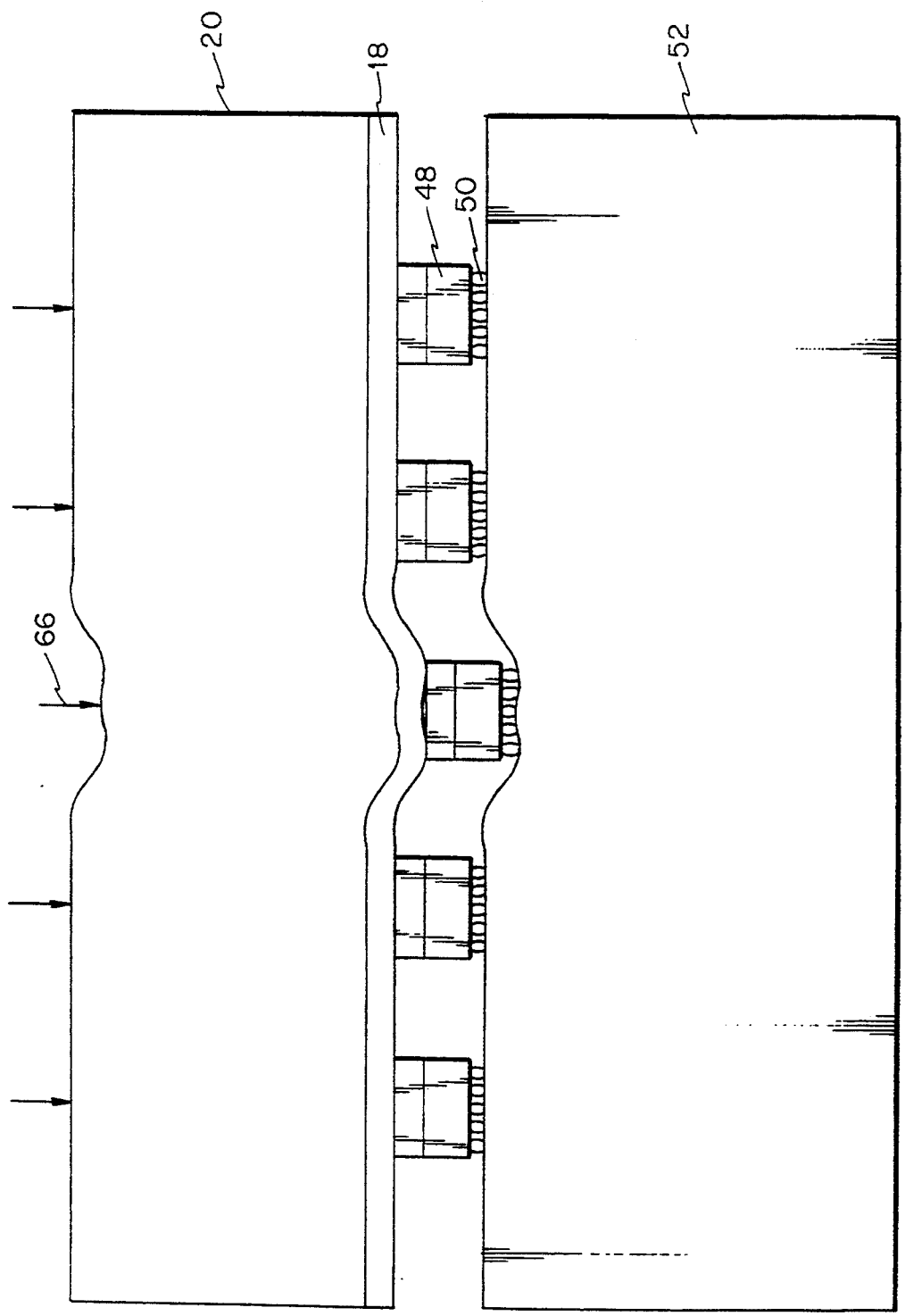
FIG. 15 is a side elevation view of a preferred embodiment of the invention illustrating local cyclic distortion compliance.

The described cooling hat complies with vertical variations without producing large stresses. A hat layer might be considerably uniformly thicker or thinner then expected, perhaps due to rubber shrinkage during curing. Nevertheless, the layers will be assembled successfully because they are bonded together along horizontal planes. A layer might be locally slightly thicker or thinner than expected. The thickness deviation is compensated for by the use of a soft material manifold which bends under the applied mild spring force. The cooling hat counteracts any global vertical displacement or tilt relative to the electronics assembly since the hat is mounted flexibly in the shell, with springs gently urging the hat against the electronics assembly. This is shown in FIG. 13. In a typical case compensation is provided for an approximately 0.5 mm displacement. The hat counteracts global curvature or camber in the hat or electronics assembly. The manifold layers are flexible because the material is soft and the coldsheet thickness is selected for flexibility. Even if the coldsheet is fabricated from a relatively hard material, it is sufficiently thin to be at least semiflexible. Since the cooling hat is at least semiflexible, under the applied force of the springs the hat bends slightly as shown in FIG. 14. The hat generally conforms to the large curvature across the substrate. In a typical case, the cooling hat is able to compensate for an approximately 20M radius of curvature, which is equivalent to a 125 $\mu$m sagitta over a 100 mm chord. The semiflexibility of the hat also provides limited compliance to counteract tiny variations in tilt and height variations from chip to chip. This is shown in FIG. 15. In a typical case the cooling hat is able to compensate for an approximately 20M radius of curvature, which is a 1 $\mu$m sagitta over a 8.5 mm chord. The hat is insensitive to horizontal misalignment. In a preferred embodiment, the coldsheet has a uniform pattern of fins and grooves across the active area and a uniform fluid flow density is provided across the active cooling area. Thus, even a large misalignment between a chip and the hat will not degrade chip cooling. Within the manifold the fluid flows in orthogonal directions in adjacent tiers. Therefore, moderate misalignment between adjacent tiers still results in proper flow (except near the edges).

As used herein, the term "compliance" refers to features which compensate by bending rather than in the prior art "piston cooling" where motion of rigid pistons provided compliance.

An objective of the invention is ease of manufacturability. That is, both fabrication and assembly are accomplished with little labor, low cost, and robustness against manufacturing variations. Several distinctive structures and construction features accomplish these goals. Each cooling hat component is a layer which serves all the chips in the assembly. The hat generally includes only a relatively few layers. Each layer is efficiently fabricated using a "master" including the use of a mask to lithographically fabricate the fins and grooves in the coldsheet, and a mold die to fabricate each manifold layer. Once the master is made, to replicate successive layers requires little labor and low cost, and is almost independent of the number of chips to be cooled by the hat. The few critical dimensions are largely guaranteed to be met through fabrication with a master. Thus the process window is large, and the yield per layer is high resulting in a low cost cooling hat. For an electronics assembly with many chips, the cooling cost per chip is small.

By contrast, in the prior art of piston cooling, each chip required a piston and cylinder. The labor and cost increased approximately linearly with the number of chips. Also, more chip power density generally requires fabricating each piston and cylinder with reciprocally tighter tolerance.

The distinctive features of the present invention can be conceptually unified. The structure and construction of fluid logic systems briefly flourished in the 1960s. They were sometimes constructed like printed circuits or integrated circuits for fluids and were sometimes called "fluid integrated circuits" or "fluidics". The present cooling hat is a novel in applying fluidic structure and construction to cooling, a role far removed from the original fluid logic.

The cooling hat is described above in conjunction with well separated chips, 4.5 mm chips on 8.5 mm pitch. Nevertheless, the hat allows uniform cooling throughout the active area. Thus the hat can cool a denser electronic assembly, with chips mounted shoulder-to-shoulder in close proximity, but having the same local power density and the same total area. The hat is also able to cool a wafer with high power density.

In general, the groove width on the cold plate is inversely proportional to the cooled local power density divided by the temperature drop. The resultant width defines a groove pitch and groove segment length. In general, the pitch of the coarsest tier approximates the substrate width. Between these two extreme tiers, the intermediate tiers should interpolate in a hierarchy. One example is an exponential hierarchy with a ratio of 4. The total flow cross section of each tier is proportional to the power density divided by the temperature drop. Thus the number of layers depends logarithmically on the parameters of the electronics assembly, including the power density divided by the temperature drop.

Thus the number of layers depends logarithmically on the parameters of the electronics assembly, including the power density and the total power. Conversely, a hat with a few layers can cool a large electronic assembly with exponentially many chips.

In many cases, even fewer layers are sufficient. Consider a hat with ports, ducts, channels and grooves but no capillaries. This provides considerable cooling with moderately low viscous drag. Nevertheless, adding the capillaries lowers the viscous drag which allows finer grooves and better cooling. Next, consider another electronics assembly, with several times less power density. Such an assembly may be cooled by a hat with a cold-sheet that is several times coarser, and a manifold having fewer tiers. Depending on the details, a manifold with three tiers, two tiers, or even one tier can cool an electronic assembly.

In some cases, the cooling system should be modified or "personalized" to counteract significant predictable variations. Often the power or power density varies considerably from chip to chip. In some cases, interchip synchronization and communication requires minimizing the inter-chip temperature differences. Thus overcooling a low power density chip is to be avoided. Also excessive cooling wastes coolant flow. In many cases, the chips are not tightly packaged on the substrate and hence uniform cooling and flow over the cold-sheet is wasteful. It is preferable to concentrate cooling and coolant flow to the cold-sheet area adjacent to each chip.

In some cases, different chips produce different powers and are of different sizes. One solution is to spatially modulate the coolant flow and cooling density by reducing the coolant flow to chips with low power or low power density and eliminating or reducing the flow density to coldsheet areas not adjacent to a chip. One such embodiment is shown FIG. 16. Between the coldsheet 14 and the fine manifold layer 16, there is a tape layer 110 which has a small perforation 112 and large perforation 114 over thin chip 116 and thick chip 118, respectively. The area of each perforation is "personalized" to match the power of the associated individual chip. Perforating can be done by last ablation, which can be readily and inexpensively changed to manufacture hats for an assortment of different electronic assemblies. Die cutting is a less flexible alternative for forming the perforations in the tape.

An alternative personalized cooling embodiment is to locally modify the pattern of fins and grooves. For example, eliminate grooves in the regions where cooling is not required as illustrated by coldsheet 14 in FIG. 16. Another alternative embodiment is to modify the pattern of conduits in the finest tier of the manifold in order to personalize the cooling. However, the latter solutions generally require personalized masks or molds which complicates the process of manufacturing cooling hats when there is an assortment of different electronic assemblies.

In some cases, there are significant predictable height differences between chips. For example, memory and logic chips might differ in height. Also, an electronic assembly for individually packaged chips on a printed circuit card often mixes packages of various heights. For example, an electronic assembly might mix integrated circuit chips with capacitors, which have different heights.

FIG. 16 shows a solution to the problem of different chip height by the addition of a button 120 located between the coldsheet 14 and the thinner chip 116. Another way to match vertical differences between chip heights is to use an embossed coldsheet or a vertically personalized duct block.

Figure 17A:
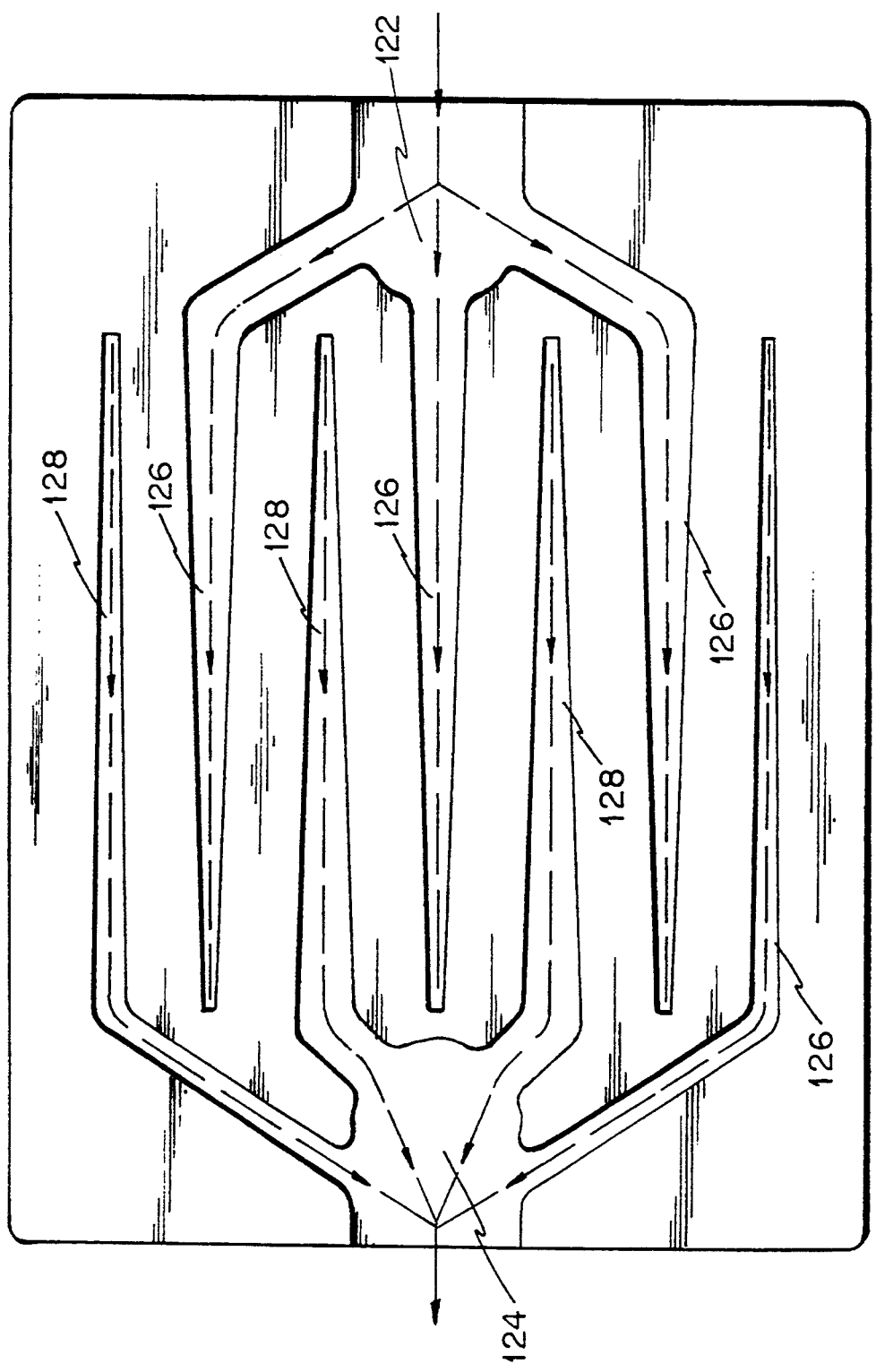
FIG. 17A is a top plan view of a duct block.
Figure 17B:
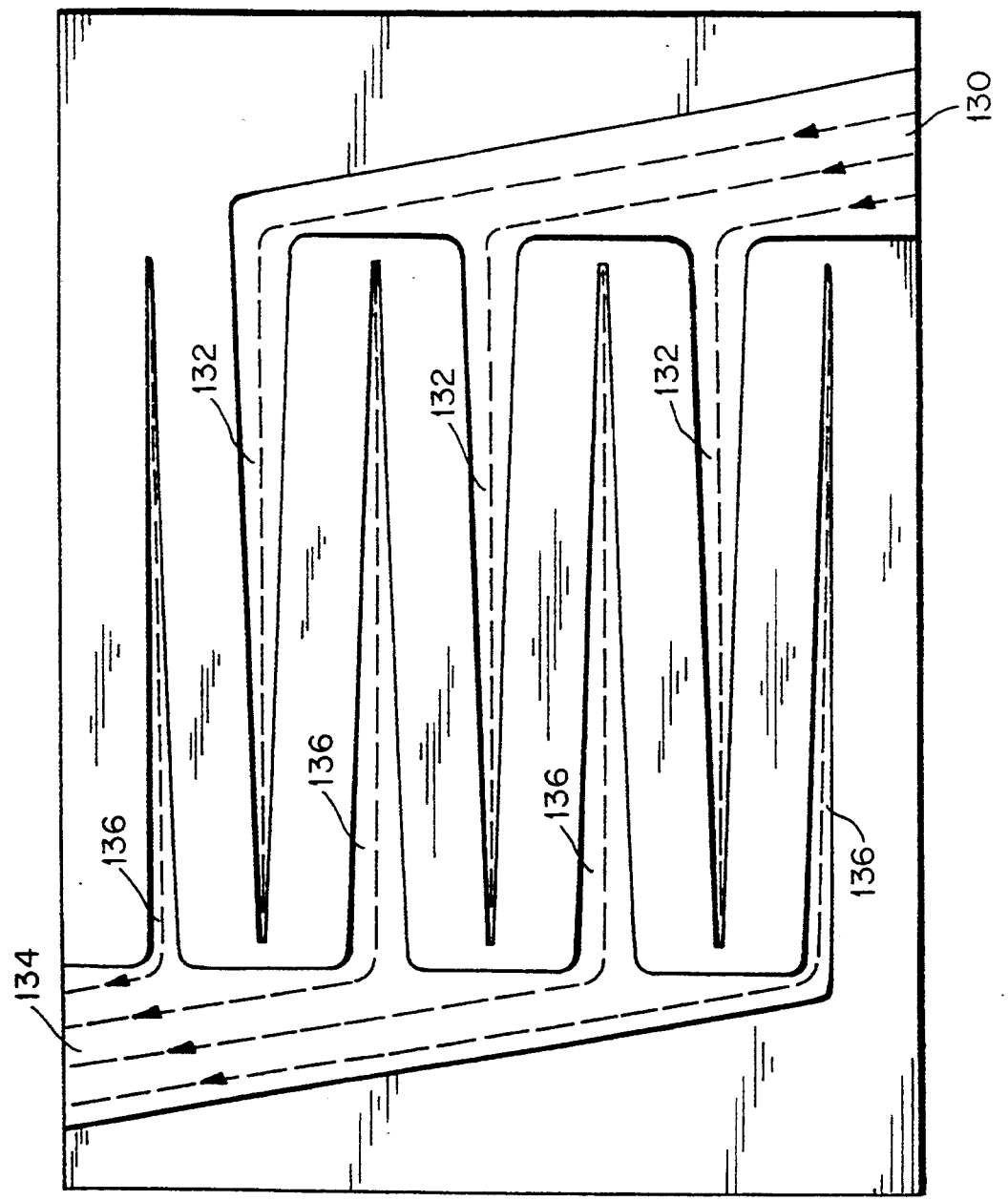
FIG. 17B is a top plan view of another duct block.
Figure 17C:
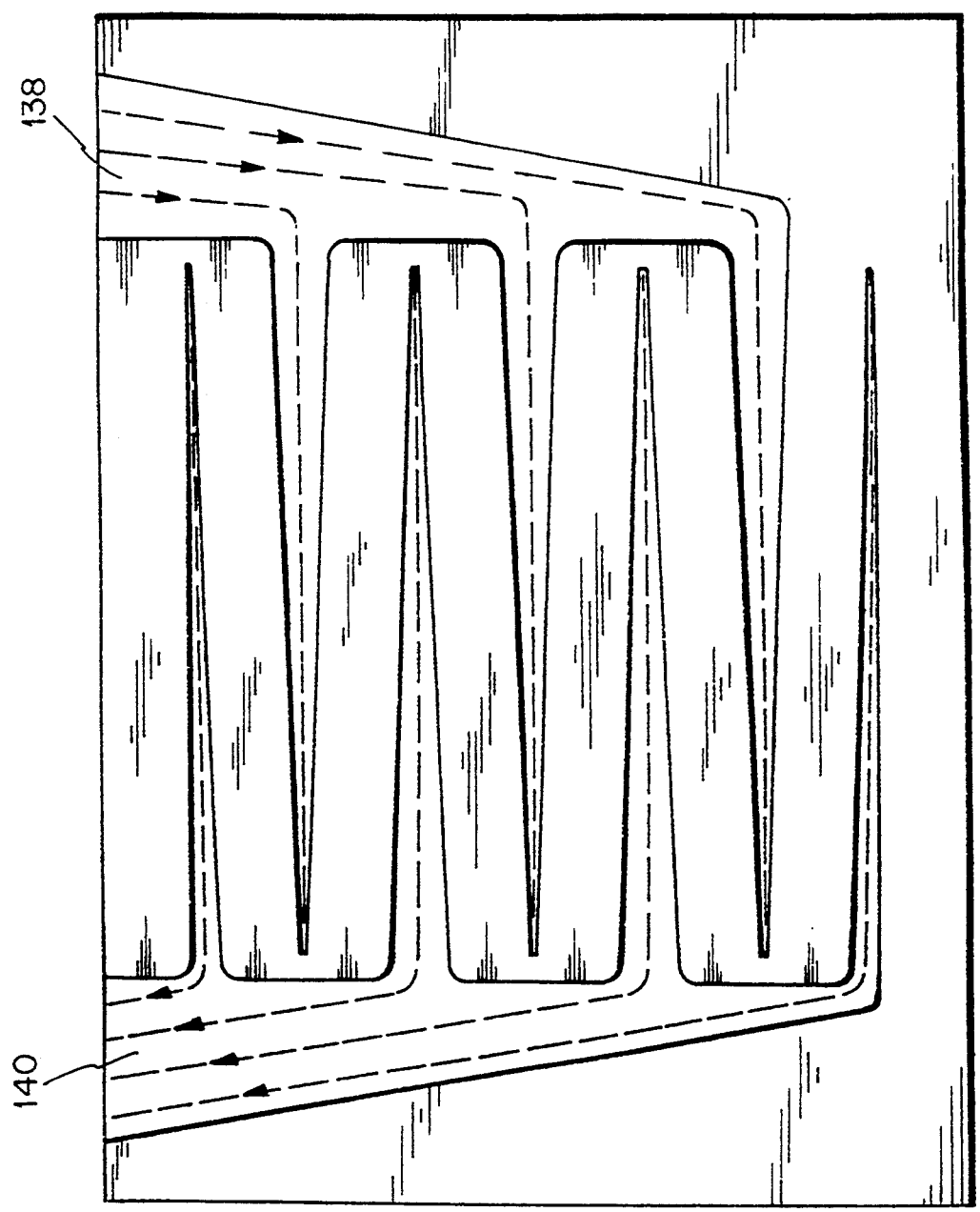
FIG. 17C is a tip plan view of a further duct block.

Some applications require compactness in one direction but require space in another. For clarity assume that the coldsheet is in horizontal plane and that the ducts flow from left to right in the figures. For vertical compactness, the horizontal ports are coplanar with the ducts. FIG. 17A shows an embodiment where fluid flows from supply port 122 to return port 124 both in supply channels 126 and return channels 128 as shown. FIG. 17B shows an embodiment where the fluid flows from supply port 130 via supply channels 132 to return channels 136 to return port 134 from the bottom to top as shown. FIG. 17C shows an embodiment where fluid flow from supply port 138 flows in a direction from top to bottom to return port 140 from bottom to top as shown. By contrast, for maximum horizontal compactness, the vertical ports are disposed directly above the ducts in the vertical direction.

Conduits can be tapered either vertically or horizontally or both. FIGS. 4 and 5 show vertical tapering, which assists horizontal compactness. FIGS. 17A, 17B, and 17C shows horizontal tapering, which permits more vertical compactness.

In some cases, several tiers can be unified in a single piece. These tiers may be coplanar, or may be noncoplanar but in either event are fabricated simultaneously. Sometimes unification reduces construction cost but complicates moldability. The ports and ducts can be unified in a single piece. Two-sided fabrication (especially molding) facilitates unification. A manifold layer can be molded with channels on the bottom, vias in the middle, ports and ducts on the top. Another integrated piece connects the ports to a lid. The port and lid pieces cover the top of the duct and channel piece. An alternative embodiment unifies the capillaries and channels. Thus one layer has capillaries on the bottom, capillary vias in the middle and channels on the top. The next manifold layer has channel vias on the bottom, ducts and ports on the top. An extreme version has a single layer which unifies coplanar grooves, ducts and ports so that the fabrication is totally unified and minimized. However, such a layer must be made of the same material as the fins, typically metal, thereby creating a conflict between a large flow cross section and thin semiflexible part. Also the channel and duct areas reduce the area for the fins and grooves. However, fabrication is unified and minimized. Depending on the fabrication and assembly processes, there are many other ways to unify tiers. In general, unification reduces parts count and fabrication costs, and guarantees alignment within each manifold layer. However alignment between layers still requires care.

The construction of several tiers in separate parts, or one part with several noncoplanar tiers, or one part with several coplanar tiers will be described.

In some cases, one tier may be made from several parts. For example, a very large horizontal channel sheet is fabricated by horizontally splicing several channel sheets.

Figure 18:
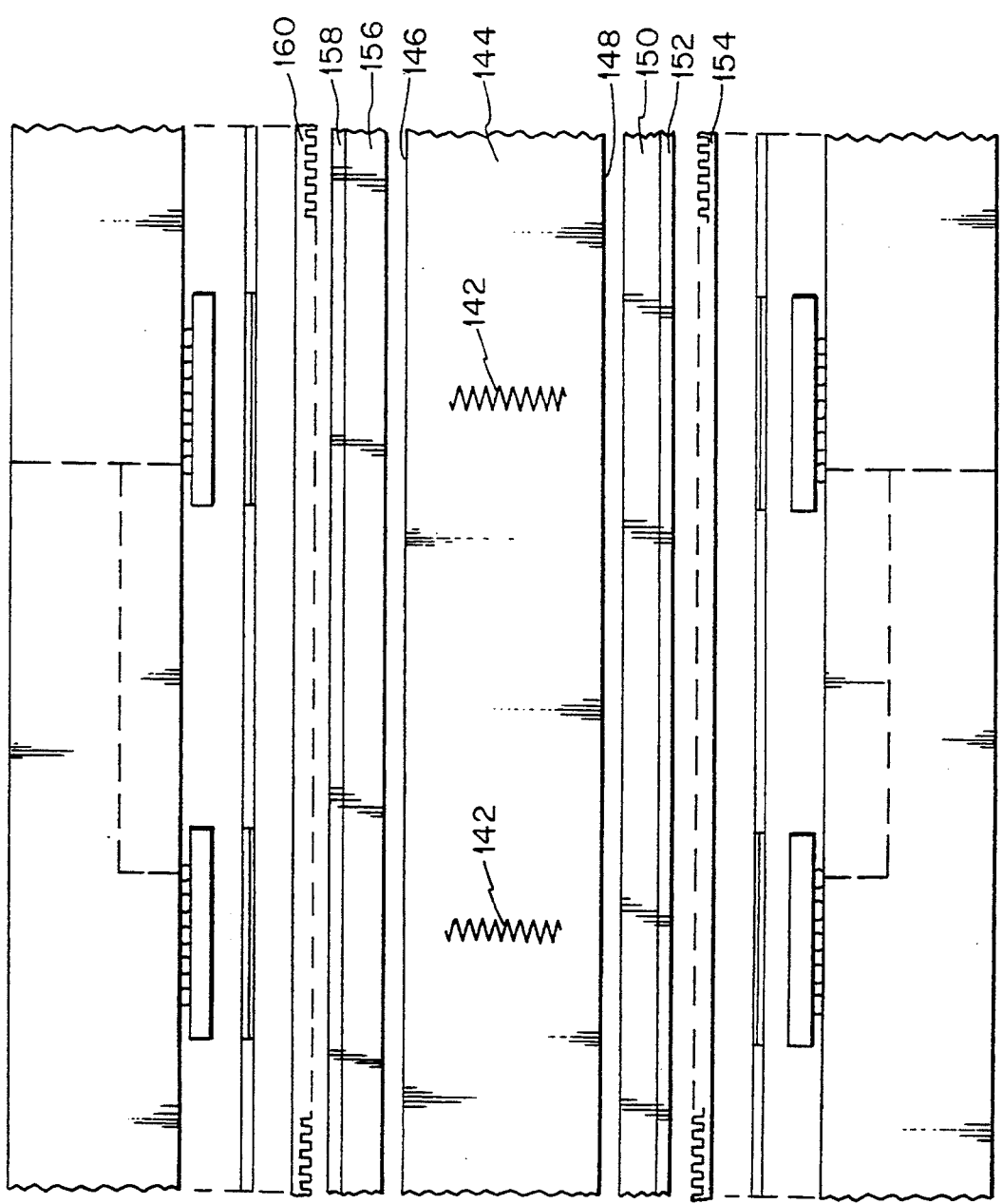
FIG. 18 is a side elevation view of a two-sided cooling hat.

In the preferred embodiment, as shown in FIG. 18 distinct springs 142 are provided for creating a reliable controlled compression. The result is vertical compliance, but at the cost of extra hardware. In some cases, the springs can be unified with other parts of the hat. For example, a rubber duct block 144 is molded around the metal springs 142. A more unified version is to eliminate metal springs and to rely on the elasticity of the manifold material. However, this requires care so "rubber creep" (inelastic deformation or slow flow) does not slowly weaken elastic forces. Another embodiment uses the springiness of the shell or coldsheet. Thus the shell or coldsheet is fabricated to be slightly convex pointing towards the electronic assembly. Another version is to use hydraulic-pneumatic pressure difference between the top and bottom of the coldsheet. A related version is to pneumatically evacuate the electronic assembly. Unfortunately the hydrostatic pressure changes during the ON/OFF cycle.

While the preferred embodiment shows a rectangular pattern of conduits, other patterns can also be used, perhaps with some loss of self-alignment. The other arrangements include grids of concentric circles and radial lines. Many other suitable grids can be constructed by the mathematical theory of complex analytic functions.

Still more generally, successive tiers do not have to be locally orthogonal. For example they can be oriented at an angle, typically an angle of 60 degrees. That is, a first tier includes ducts running at 0 degrees, alternating between supply and return ducts. The next tier includes channels at 60 degrees, alternating between supply and return channels. The next tier includes fins and grooves at 120 degrees. In another example, conduits may be non-uniformly spaced or not exactly parallel to each other within a tier. One skilled in the art can readily find many more useful conduit patterns.

In some cases, extreme vertical compactness is critical. FIG. 18 shows a two-sided hat. The duct block 144 has coplanar ports and ducts, as shown in FIG. 17A. However the two-sided duct block has ducts which open to the top surface 146 and to the bottom surface 148 of the duct block 144. Also in the middle of this block are springs 142 which simultaneously press to the top and to the bottom direction. Adjacent to the bottom surface 148 are layers with bottom channels 150 bottom capillaries 152 and a bottom coldsheet 154. Adjacent to the top surface 146 are inverted layers including top channels 156, top capillaries 158, and a top coldsheet 160. The application of this hat will be explained below. Additional features facilitate thinness. For instance, the duct width is made a large fraction of the pitch so that the duct height is smaller. Alternatively the tiers are tapered horizontally rather than vertically or the ports are rectangular rather than circular. Also, the wasted coolant flow can be minimized by personalized flow, as explained above. In some cases, the power per electronic assembly is not large, thereby allowing a reduction of the coolant flow, the total flow cross section, and the duct height. Also depending on the desired power density, fewer tiers may be sufficient and/or several tiers may be made coplanar.

The present invention is useable with different thermal joints which permit lateral sliding between chip and coldsheet. The preferred joint depends on the cooling goal and on the degree of chip coplanarity. A versatile compliant thermal joint has two layers comprising a thick layer of high thermal conductivity material, and a thinner layer of lubricant. The compliant joint is most advantageous when high cooling is needed and the chips are not coplanar. Various thermally loaded pastes have been developed. One example is a synthetic oil with fine particles of aluminum nitride. A paste joint is advantageous when the chips are generally coplanar and intermediate cooling density is adequate. Another joint is lubricant alone. An example of such a lubricant is a thin layer of oil plus an ultra-thin anti-adhesion coating. A typical lubricant is polyaliphatic olefin oil with a coating of hydrogenated amorphous carbon applied by chemical vapor deposition. This lubricant-only joint is useful if the chips are quite coplanar, the cold-sheet is especially flexible (thin), and intermediate cooling density is adequate.

U.S. Pat. No. 4,567,505 describes a joint using oil with reentrant tiny cavities in the bottom surface of the coldsheet. Thus capillary attraction pulls the coldsheet and chips together which reduces the need for springs. Such a joint is useful with the present invention. However, such a joint by itself provides limited vertical compliance and hence favors coplanar chips and a flexible (thin) cold-sheet with reentrant tiny cavities in buttons on the bottom surface. In some special cases, a non-sliding joint can also be used.

In the present invention, the cooling hat and thermal joint provide complementary compliance modes. Depending upon the application, both modes are required to differing degrees. Thus, there is symbiosis between the cooling hat and the thermal joint.

The thermal joint slides in order to comply with lateral variations, especially differential thermally induced distortion. The thermal joint fills gaps to comply with the vertical variations of each individual chip: variations in chip height and chip tilt. In contrast, the joint by itself is inadequate to comply with very large vertical variations across the entire module.

The cooling hat provides compliance for vertical variations over large distance, e.g. across the entire surface of a module: variations in global height, global slope, global curvature. The hat provides almost no lateral compliance and very little compliance for chip vertical direction variations.

In the preferred embodiment, the heat transfer fluid is water. Nevertheless, this hat is "omnivorous". Depending on the application, it can be used with various fluids and various operating modes. These include the following: a liquid which transfers heat by changing temperature including water, perflurocarbons or other dielectric liquid, other fluids include liquid nitrogen or liquid helium or other cryogenic fluid, hyperbaric liquified $CO_2$ or other gas liquified by pressure, liquid gallium or other liquid metal, a gas which transfers heat by changing temperature including air, helium, nitrogen or gaseous $CO_2$, a gas to transfer heat by changing pressure including a compressed gas which expands adiabatically in conjunction with absorbing heat, a fluid to transfer heat by boiling including a boilable perflurocarbon or other boilable dielectric liquid, or liquid nitrogen or other cryogenic liquid which boils (The boiling liquid can be pumped mechanically, by bubble expansion, or by bubble buoyancy), a heat pipe mode where a liquid evaporates, becomes a gas, condenses, and returns by capillary action, a mixture which transfers heat by phase change including a slurry with small meltable grains, or a most with evaporatable fine droplets, a cryogenic fluid, including liquid, gas or boiling fluids. Some examples are liquid nitrogen, liquid helium and cold helium gas. The term "flowing fluid" shall be understood to refer to all of the above heat transfer modes and fluid classes.

The preferred coolant depends on the application, the performance goals, the design of hoses and sealing, and the refrigeration system.

In each case, the fin and groove geometry should be optimized for the parameters of the coolant and coldsheet, such as the ratio of their thermal conductivities. In general, the depth to pitch ratio is approximately proportional to the square root of the conductivity ratio. Various fin and groove shapes, including long fins, short fins, pin fins, tapered fins, staggered fins, and others are useful in practicing present invention.

Some power semiconductors dissipate very high power densities and are limited by cooling. One example is a large power silicon controlled rectifier (SCR) used in high power generation and transmission. In some cases, the application economically justifies aggressive cooling. For best cooling, the coldsheet should have a thermal joint directly contacting the SCR. Since the semiconductor is brittle, the hat is made rigid to support the semiconductor.

While it remains to be seen if wafer scale integration (WSI) will eventually become practical for complex electronic systems, the present hat can be used for the cooling of WSI.

Figure 19:
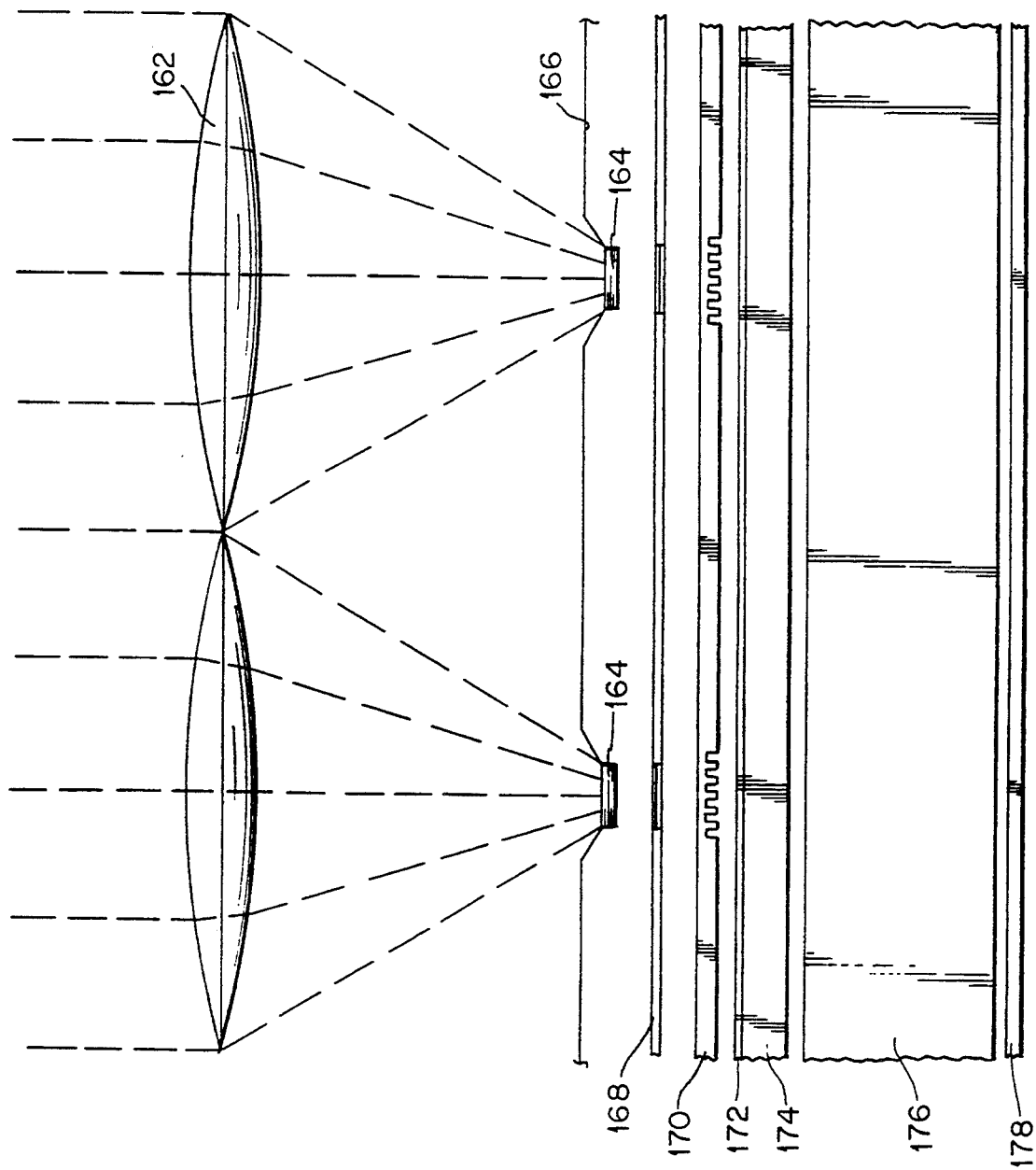
FIG. 19 is a side elevation view of a cooling hat for a concentrated solar cell.

Some solar power systems use a very large lens or mirror or greatly concentrate sunlight onto a photoelectric cell. Thus the cell can be small and economical, and have high efficiency for very high power density. However photocell efficiency generally decreases as temperature increases. Thus cooling is critical. As shown in FIG. 19, the incident sunlight is redirected by a concentrator 162 to form concentrated sunlight which is absorbed by a solar cell 164 where it generates electrical power through wire 166. The solar cell 164 is cooled through a thermal joint 168, then through a cooling hat of the present invention. One embodiment includes a coldsheet 170, a capillary sheet 172, a channel sheet 174, a duct block 176, ports (not shown), and a brace 178. The figure is simplified for clarity sake. Although the concentrator 162 is drawn as a macroscopic lens, nevertheless more practical concentrators are a Fresnel lens, a converging mirror, a reflective trough, or a non-imaging concentrator. Also, the figure exaggerates the solar cell and cooling and understates the relative size of the optical parts and the concentration ratio. In practice, the optical parts are relatively larger and the concentration is much larger. Usually it is desirable to concentrate the cooling and coolant flow to a small area adjacent to the solar cell(s). For example, the conduits are locally modified to restrict the flow or personalization cooling method as described above. The thermal joint type depends on the solar cell technology. The joint may be a compliant joint. In other cases, the solar cells are fabricated directly onto a common sheet which also acts as the coldsheet. In still other cases, a relatively rigid coldsheet and hat is used.

Advantages of the described arrangement are the low cost, good manufacturability, and the cooling of a substantial area with very high power density with a small temperature rise. Good cooling permits a very high efficiency "stacked" cell of two different semiconductors. A semiconductor with a wide bandgap can readily gather short wavelength photons and a narrow gap semiconductor can gather the more numerous long wavelength photons. The narrow gap semiconductor requires especially cool operation and places a large premium on good cooling.

The following application illustrates that the cooling hat is useful for cooling in general, not just to cool devices heated by ohmic electronic dissipation.

In the design and construction of high speed computer systems, it is important to mount many high power IC chips closely together on a common substrate. Especially with bipolar IC chips, high density cooling is a critical resource. This cooling can be advantageously achieved by the present invention. In a preferred embodiment, yielding optimal cooling, the coldsheet has fine groove and fins. In an alternate preferred embodiment, with very good cooling, there are spacers or equivalent means, and a coldsheet with textures or other structures to promote stirring and heat transfer as coolant flows adjacent to the coldsheet. In a further alternative preferred embodiment, allowing good cooling, there are spacers or equivalent means, and a coldsheet. Heat is removed as coolant flows through a gap adjacent to the coldsheet.

The hat can be used with liquid coolants which are relatively chemically inert. Such coolants include perflorocarbon liquid (such as "Fluorinert" brand from 3M Inc), or liquid nitrogen. The hat design described above is useful with slight reoptimization to match the coolant parameters. Also, the inert property of the coolant lends itself to a specialized cooling hat where the coolant directly contacts the electronic assembly as shown in FIG. 20. The global coldsheet is replaced by multiple discrete small segments 180 each bonded to a chip 182. The manifold consists of a capillary sheet 184, a channel sheet 186, and a duct block 188, ports (not shown). There are external components which gently urge the manifold against the coldsheet segments 180.

In the embodiment shown in FIG. 20, the coldsheet segments 180 each move independently. They are not part of a global metal sheet, and not bonded to the manifold. The construction allows lateral motion, and hence, lateral compliance. If necessary, a lubricant and or anti-adhesion coating may be added to the bottom of the manifold to facilitate lateral compliance. Also the construction between coldsheet segments and manifold provides a convenient demarcation for disassembly and reassembly.

The thermal joint 190 provides thermal contact and vertical attachment between the chip and its individual coldsheet segment. Therefore the thermal joint is made relatively rigid and relatively permanent. One embodiment is a wetted layer of solder which provides excellent thermal contact. However the joint thermal conductivity is offset by the poor thermal conductivity of the inert coolant liquid.

Figure 21A:
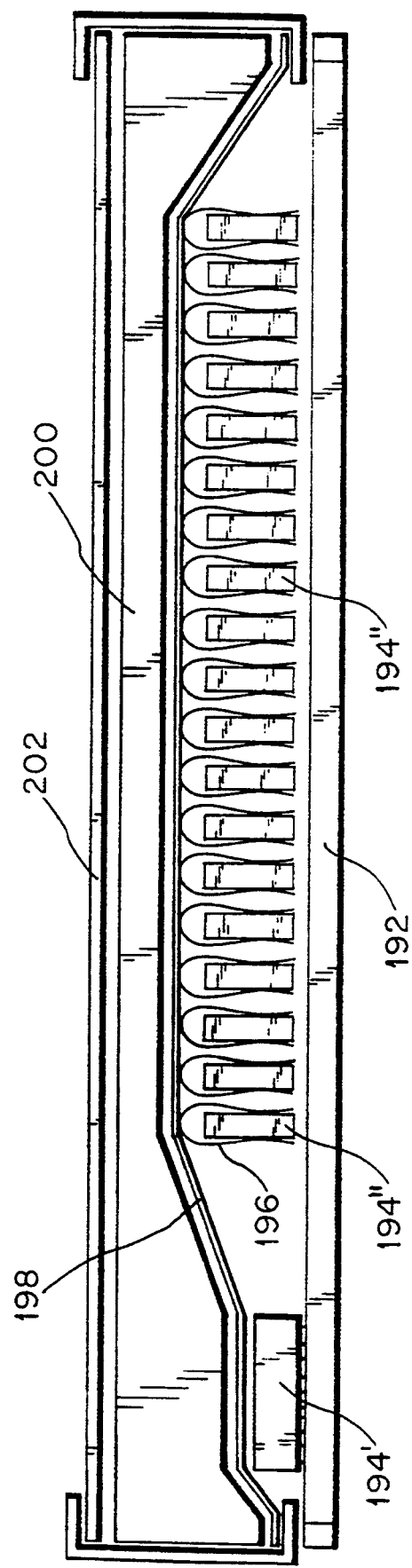
FIG. 21A is an end view of a cooling system for cooling individual components on a substrate.
Figure 21B:
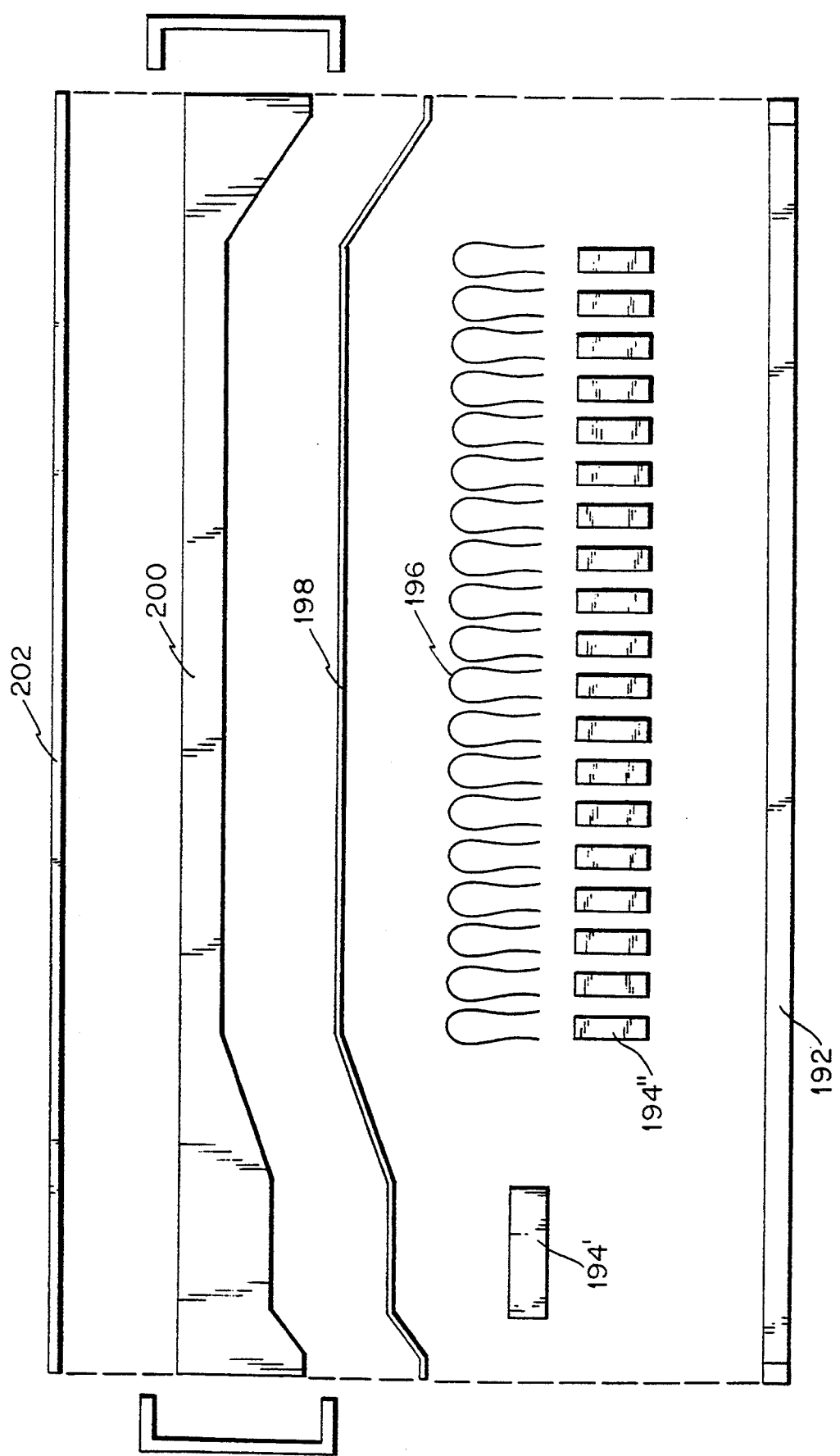
FIG. 21B is a blow-up view of the manifold system shown in FIG. 21A.

The cooling hat can cool individually packaged chips on a printed circuit card. FIGS. 21A and 21B show one embodiment in elevation views. A horizontal printed circuit board 192 has chips mounted horizontally 194' or vertically 194". Each chip is coated with a thermal joint material to enhance thermal conduction. From a vertically mounted chip 194", heat is conducted through a springy metal extender 196 to a metal coldsheet 198. The coldsheet is embossed and/or bent to match the non-planarity of the electronic assembly including chips 194' and 194" on the printed circuit board 192. There is a molded rubber manifold block 200 which includes channels, ducts and ports. A shell 202 provides spring action.

FIG. 21C shows a plan view of the manifold 200. Cold supply coolant flows from a supply port 204 through a supply duct 206 and through multiple parallel supply channels 208. Then the coolant flows adjacent to the coldsheet and where it absorbs heat. Next, warm return coolant flows through multiple parallel return channels 210, through a return duct 212, and out a return port 214.

In general the hat invention applies to cooling packaged chips on a printed circuit bard or board, as well as cooling bare chips in a multichip module. Of course, the internal thermal resistance of any chip package limits the heat transfer.

In some electronic systems it is desirable to mount electronic assemblies with a tight pitch. A thin two-faced hat was shown in FIG. 18. Used with thermal joints on the top and bottom sides, the hat can cool two adjacent electronic assemblies.

Some applications use a relatively inert coolant which allows a two-faced hat specialized for direct contact cooling, as described above. The contact from the coldsheet segment to the manifold can provide a field replaceable unit boundary where each electronic assembly can be individually replaced in the field without disturbing the thermal joints. The cooling hat permits cooling of many electronic assemblies, each with components on both sides of the substrate, and with tight pitch between the assemblies. The construction is particularly applicable to a very large computer with many parallel processing elements.

While there have been described and illustrated a cooling hat and modifications and variations thereof, it will be apparent to those skilled in the art that further modifications and variations are possible without deviating from the broad scope of the present invention which shall be limited solely by the scope of the claims appended hereto.

What is claimed is:

1. A system for transferring heat from a surface to a flowing fluid comprising:
    a non-soft material flexible manifold containing conduit means for guiding the fluid in a topologically parallel branched hierarchy.

2. A system as set forth in claim 1, further comprising a flexible sheet in thermal conduction relation with said surface.

3. A system as set forth in claim 2, wherein said flexible sheet is metal.

4. A system as set forth in claim 2, wherein said flexible sheet contains grooves and fins.

5. A system as set forth in claim 2, wherein said flexible sheet is smooth.

6. A system as set forth in claim 2, wherein said flexible sheet is textured.

7. A system as set forth in claim 2, wherein said flexible sheet includes grooves and fins.

8. A system as set forth in claim 1, further comprising a thermal joint disposed between said manifold and said surface and means for urging said surface into intimate contact with said thermal joint.

9. A system as set forth in claim 8, wherein said thermal joint includes means for facilitating sliding.

10. A system as set forth in claim 8, wherein said thermal joint includes means for filling gaps between said surface and said manifold.

11. A system as set forth in claim 2, further comprising a thermal joint disposed between said flexible sheet and said surface and means for urging said flexible sheet into intimate contact with said thermal joint.

12. A system as set forth in claim 11, wherein said thermal joint includes means for facilitating sliding.

13. A system as set forth in claim 11, wherein said thermal joint includes means for filling gaps between said flexible sheet and said surface.

14. A system as set forth in claim 1, wherein said manifold is a polymer.

15. A system as set forth in claim 1, wherein said manifold is fabricated with a master pattern.

16. A cooling hat as set forth in claim 2, wherein the thickness of said flexible sheet is in the range between substantially 50 and 750 microns.

17. A system as set forth in claim 2 wherein said manifold further comprises a supply conduit and a return conduit disposed so that the distance from the center of said supply conduit to the center of said return conduit is less than approximately 4 mm.

18. A system for transferring heat between a plurality of power dissipating components and a flowing fluid comprising;
    a flexible coldsheet in thermal conduction relation with said plurality of components; and
    a non-brittle soft material flexible manifold coupled to said coldsheet including means for guiding the fluid in a topologically parallel branched hierarchy.

19. A system as set forth in claim 18, wherein said flexible coldsheet is metal.

20. A system as set forth in claim 19, wherein said flexible coldsheet contains grooves and fins.

21. A system as set forth in claim 18, wherein said flexible coldsheet is smooth.

22. A system as set forth in claim 18, wherein said flexible coldsheet is textured.

23. A system as set forth in claim 18, wherein said flexible coldsheet includes grooves and fins.

24. A system as set forth in claim 18, further comprising a thermal joint disposed between said components and said coldsheet and means for urging said coldsheet into intimate contact with said thermal joint.

25. A cooling hat as set forth in claim 24, wherein said thermal joint includes means for facilitating sliding.

26. A system as set forth in claim 24 wherein said thermal joint includes means for filling gaps between said components and said coldsheet.

27. A system as set forth in claim 18, wherein said manifold is a polymer.

28. A system as set forth in claim 27 wherein said manifold is fabricated with a master pattern.

29. A system as set forth in claim 18, wherein the thickness of said flexible coldsheet is in the range between substantially 50 and 750 microns.

30. A system as set forth in claim 18 wherein said manifold further comprises a supply conduit and a return conduit disposed so that the distance from the center of said supply conduit to the center of said return conduit is less than approximately 4 mm.

31. A system for transferring heat from a plurality of power dissipating components to a flowing fluid comprising:
    a non-brittle soft material flexible manifold including conduit means for guiding the fluid in a topologically parallel branched hierarchy, said conduit means being arranged in tiers, and
    connector means coupling successive tiers including means for maintaining constant fluid flow speed across at least one of said connector means.

32. In a system for transferring heat from a plurality of components to a coldsheet and then to a flowing fluid comprising:
    means disposed for causing said coldsheet to compensate for the vertical positions of said plurality of components, and
    a non-brittle soft material flexible including conduit means for guiding the fluid in a parallel branched hierarchy.

33. A system for transferring heat as set forth in claim 32, wherein said plurality of components are disposed on a substrate and the heat is transferred from a component surface opposite said substrate.

34. A system for transferring heat as set forth in claim 32, wherein said coldsheet is flexible.

35. A system for transferring heat as set forth in claim 34, wherein said flexible coldsheet is unitary.

36. A system for transferring heat as set forth in claim 32, further comprising a thermal joint disposed between said plurality of components and said coldsheet wherein said thermal joint further includes means for facilitating sliding.

37. A system for transferring heat as set forth in claim 32, further comprising a thermal joint disposed between said plurality of components and said coldsheet wherein said thermal joint further includes means for filling gaps between said plurality of components and said coldsheet.

38. A system for transferring heat as set forth in claim 32, further comprising a thermal joint disposed between said plurality of components and said coldsheet wherein said thermal joint further includes means for facilitating sliding and means for filling gaps between said plurality of components and said coldsheet.

39. A system for transferring heat as set forth in claim 32 wherein said manifold is a polymer.

40. A system for transferring heat as set forth in claim 32, wherein said manifold is fabricated from a master pattern.

41. A system for transferring heat as set forth in claim 32, wherein said conduit means is arranged in tiers.

42. A system for transferring heat as set forth in claim 41, further comprising connector means for coupling successive tiers including means for maintaining constant fluid flow speed across at least one of said connector means.

43. A system for transferring heat as set forth in claim 41, wherein at least one of said conduit means has a tapered cross-section.

44. A system for transferring heat as set forth in claim 32 further comprising means for personalizing the fluid flow over said coldsheet.

45. A system for transferring heat as set forth in claim 32, further comprising a second oppositely disposed coldsheet for forming a two-sided coldhat.

46. A system for transferring heat as set forth in claim 32 wherein said coldsheet includes a pattern of fins and grooves.

47. A system for transferring heat as set forth in claim 46, wherein said pattern of fins and grooves is personalized for matching the individual power of each of said plurality of components.

48. A system as set forth in claim 32 wherein said manifold further comprises a supply conduit and a return conduit disposed so that the distance from the center of said supply conduit to the center of said return conduit is less than approximately 4 mm.

* * * * *